(12) United States Patent
Iwakaji et al.

(10) Patent No.: US 10,573,732 B2
(45) Date of Patent: Feb. 25, 2020

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Yoko Iwakaji, Meguro Tokyo (JP); Tomoko Matsudai, Shibuya Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/122,007

(22) Filed: Sep. 5, 2018

(65) Prior Publication Data

US 2019/0296133 A1  Sep. 26, 2019

(30) Foreign Application Priority Data

Mar. 23, 2018 (JP) .................. 2018-055860

(51) Int. Cl.
*H01L 29/739* (2006.01)
*H01L 29/423* (2006.01)
(Continued)

(52) U.S. Cl.
CPC ........ *H01L 29/7397* (2013.01); *H01L 21/761* (2013.01); *H01L 21/765* (2013.01); *H01L 27/0635* (2013.01); *H01L 29/0619* (2013.01); *H01L 29/1095* (2013.01); *H01L 29/4236* (2013.01); *H01L 29/4238* (2013.01); *H01L 29/42376* (2013.01); *H01L 29/4916* (2013.01)

(58) Field of Classification Search
CPC ............ H01L 29/7397; H01L 29/4236; H01L 29/0696
See application file for complete search history.

(56) References Cited

U.S. PATENT DOCUMENTS 9,196,722 B2  11/2015  Miyakoshi et al.
9,324,848 B2   4/2016  Sumitomo et al.
(Continued)

FOREIGN PATENT DOCUMENTS

JP   2000-101076 A   4/2000
JP   2006-210535 A   8/2006
(Continued)

*Primary Examiner* — Mark V Prenty
(74) *Attorney, Agent, or Firm* — White & Case LLP

(57) ABSTRACT

A semiconductor device according to as embodiment includes a semiconductor layer having a first plane and a second plane; a first trench provided in the semiconductor layer; a first gate electrode provided in the first trench; a second trench provided in the semiconductor layer; a second gate electrode provided in the second trench; a third trench provided in the semiconductor layer; a first resistive layer provided in the third trench; a first electrode provided on a side of the first plane of the semiconductor layer; a second electrode provided on a side of the second plane of the semiconductor layer; and a gate electrode pad provided on the side of the first plane of the semiconductor layer, is electrically connected to the first gate electrode through the first resistive layer, and is electrically connected to the second gate electrode.

16 Claims, 17 Drawing Sheets

(51) Int. Cl.
*H01L 29/10* (2006.01)
*H01L 29/49* (2006.01)
*H01L 29/06* (2006.01)
*H01L 27/06* (2006.01)
*H01L 21/761* (2006.01)
*H01L 21/765* (2006.01)

(56) References Cited

U.S. PATENT DOCUMENTS

| | | |
|---|---|---|
| 2014/0209972 A1 | 7/2014 | Sumitomo et al. |
| 2015/0129927 A1 | 5/2015 | Sumitomo et al. |
| 2019/0296133 A1* | 9/2019 | Iwakaji ................ H01L 21/765 |

FOREIGN PATENT DOCUMENTS

| | | |
|---|---|---|
| JP | 2013-251296 A | 12/2013 |
| JP | 2014-216352 A | 11/2014 |
| JP | 5742672 A | 5/2015 |
| JP | 2015-159329 A | 9/2015 |

\* cited by examiner

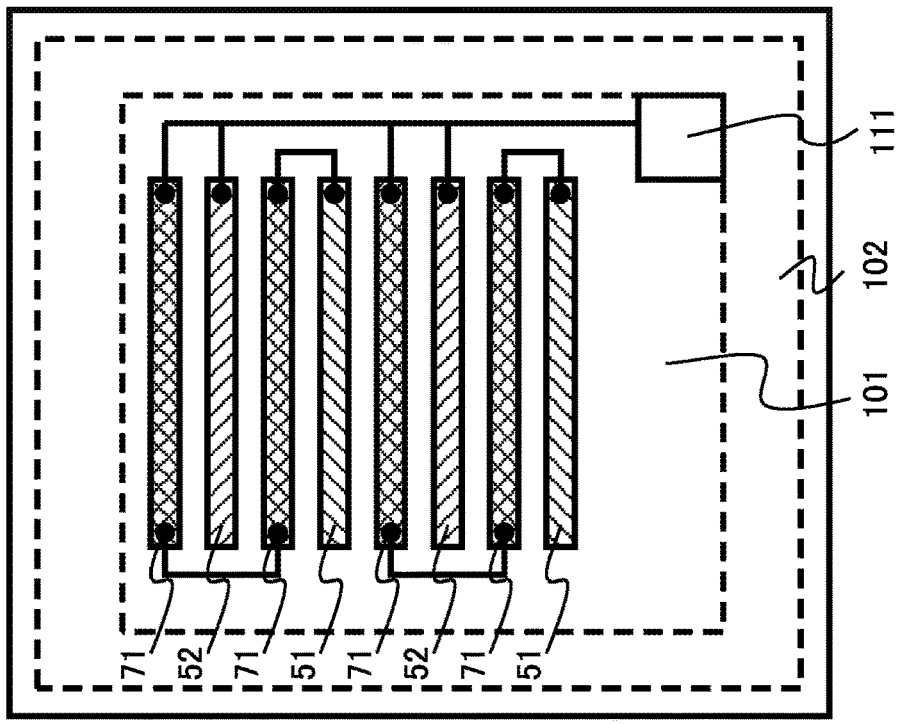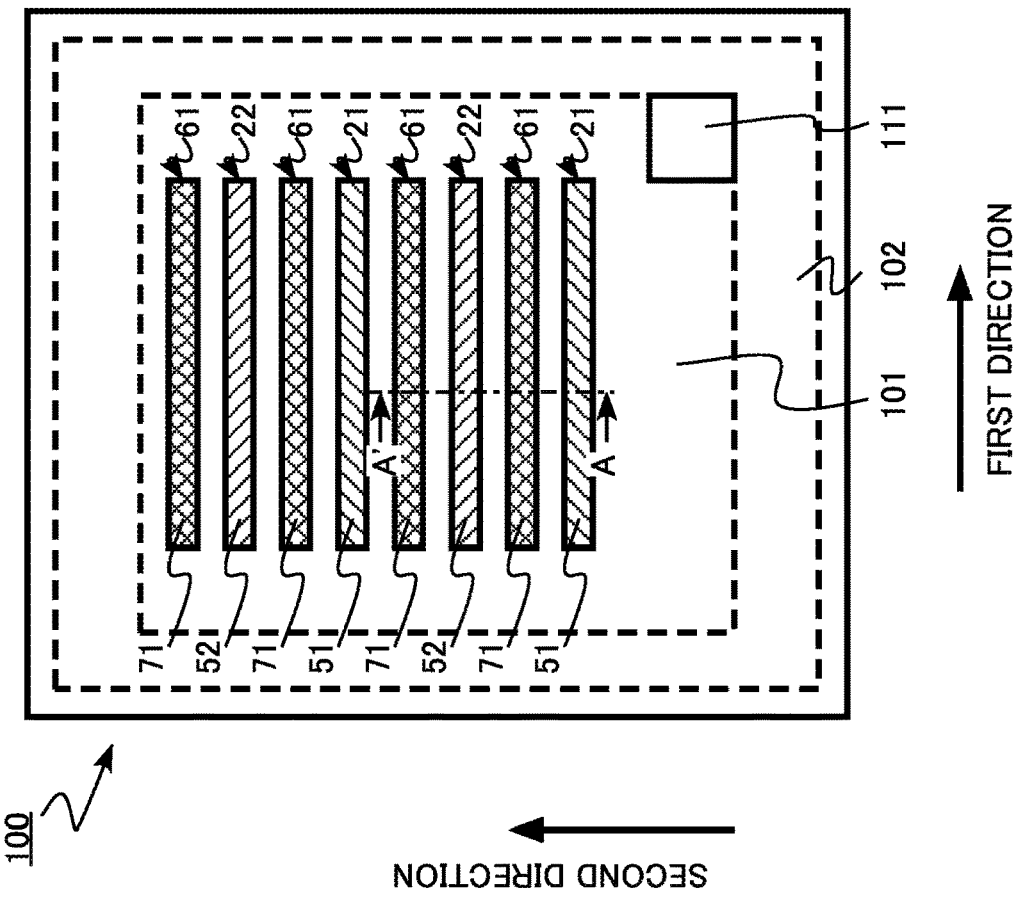

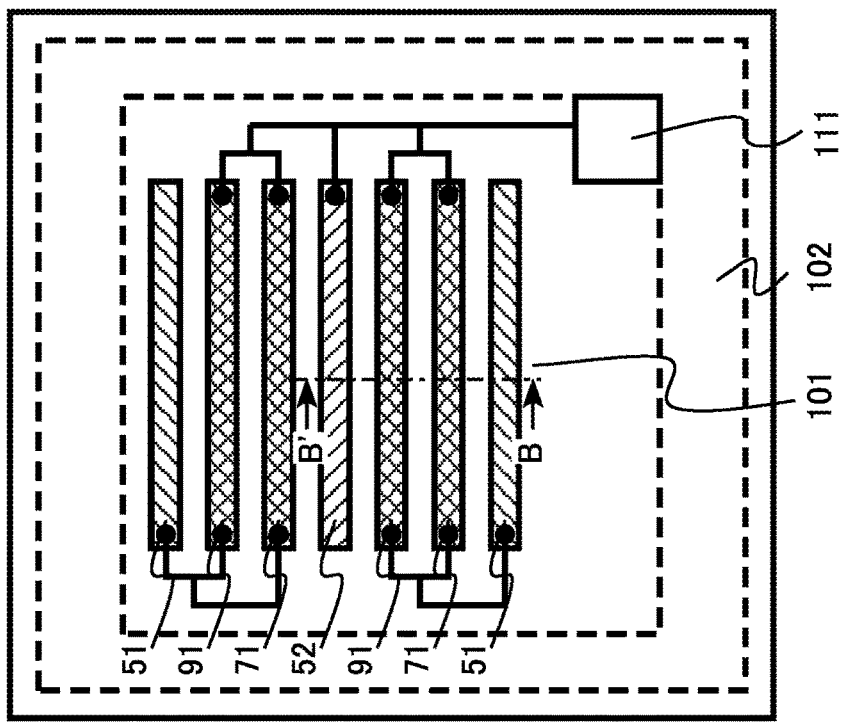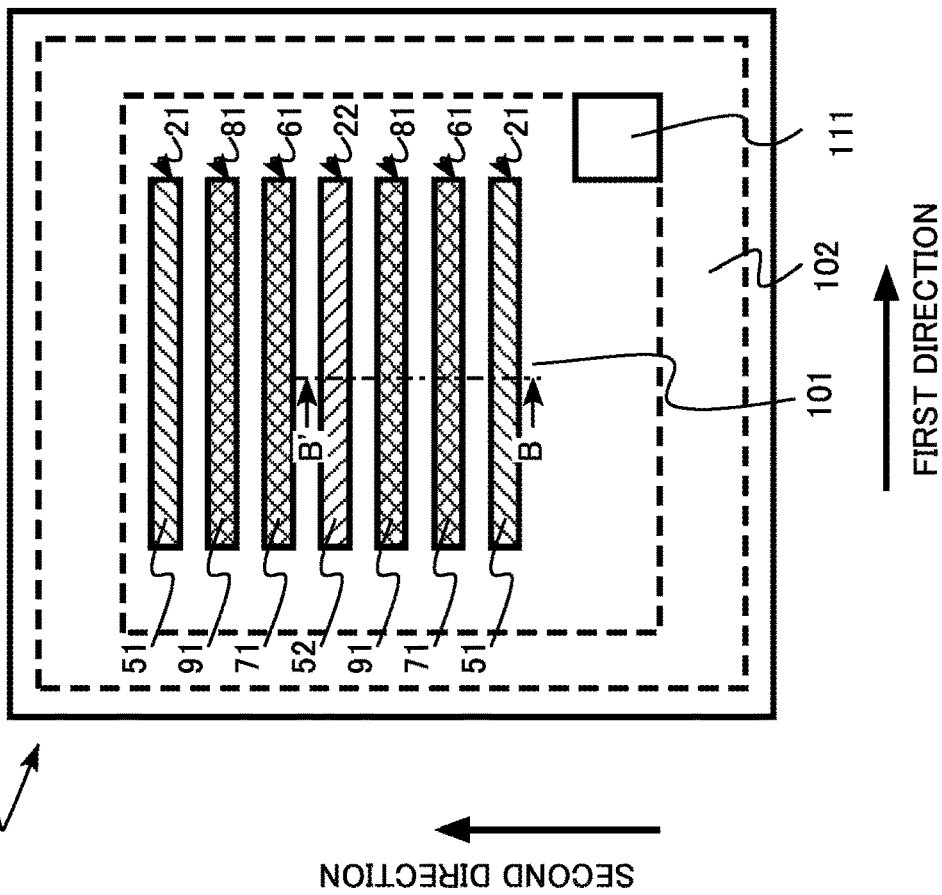

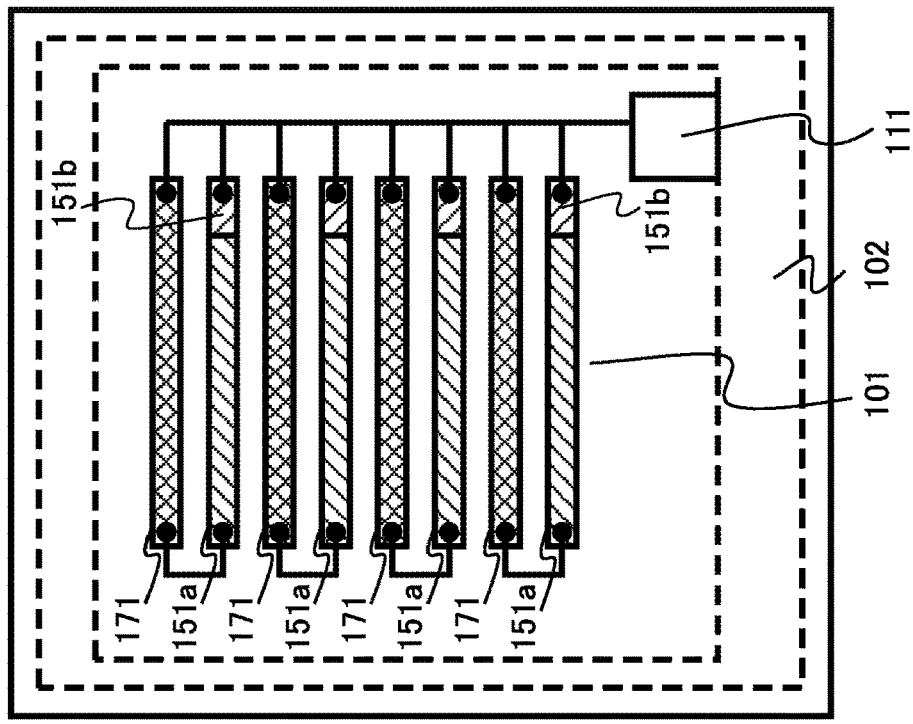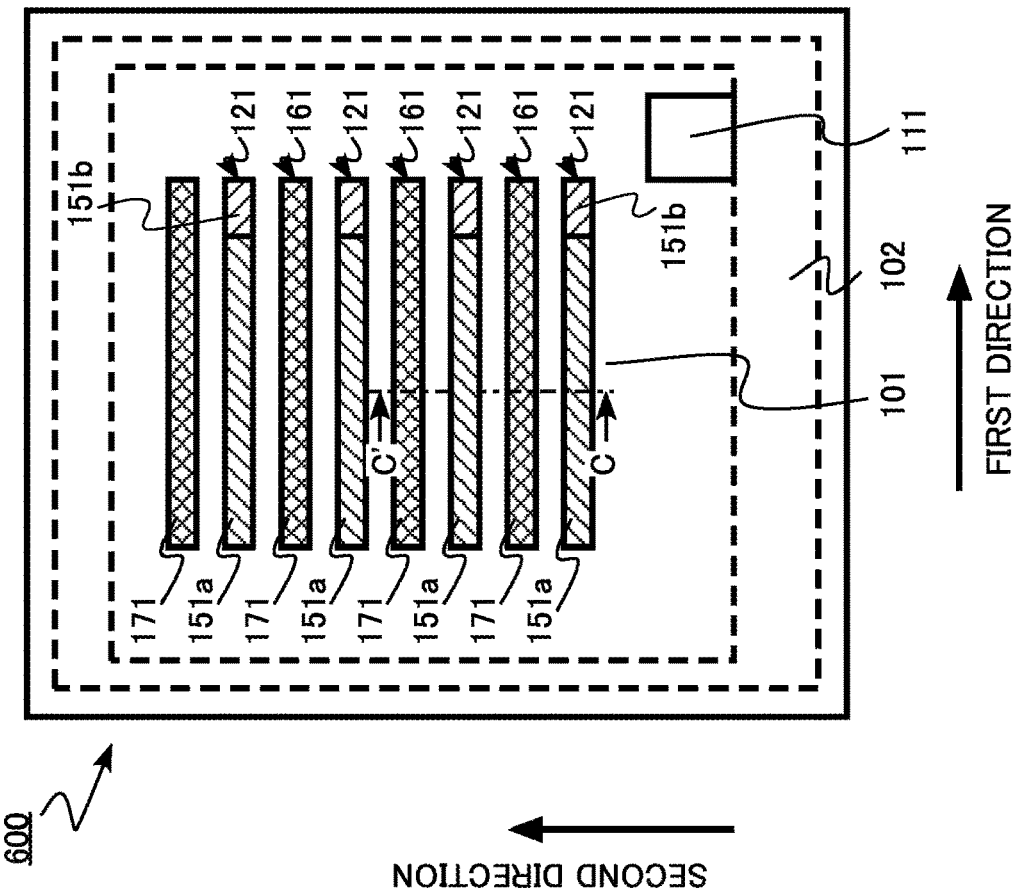

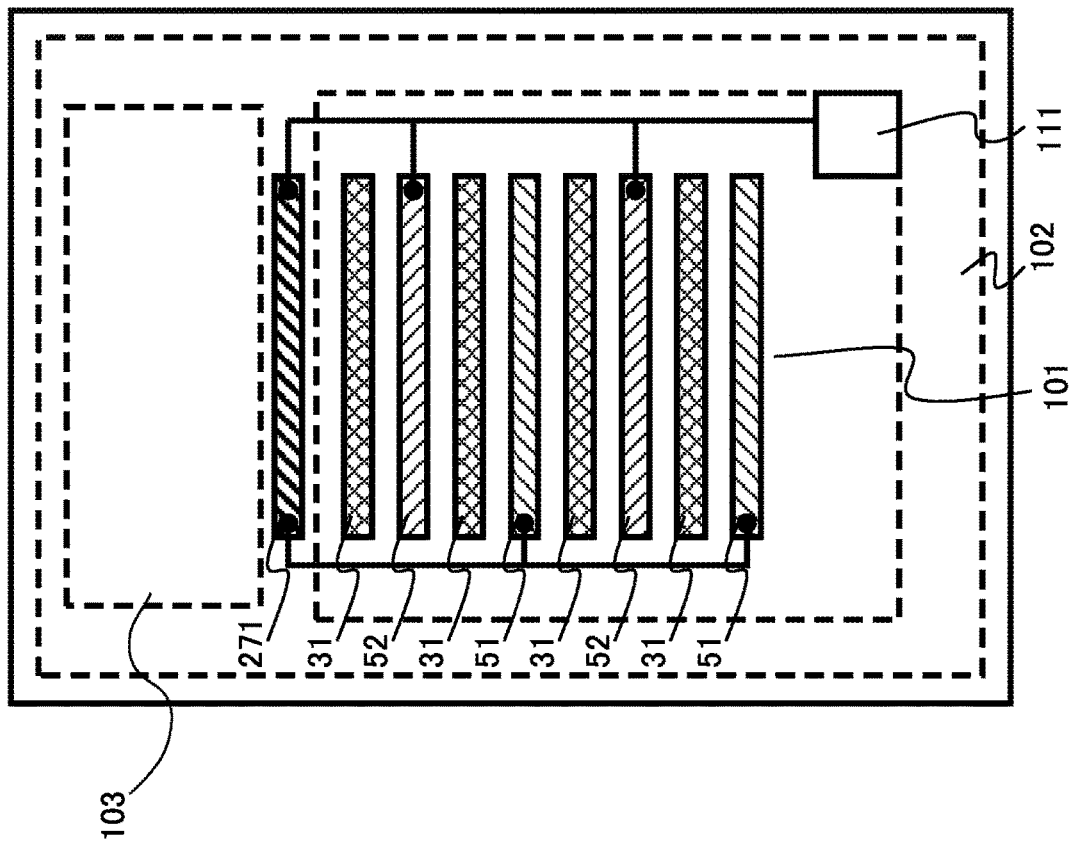
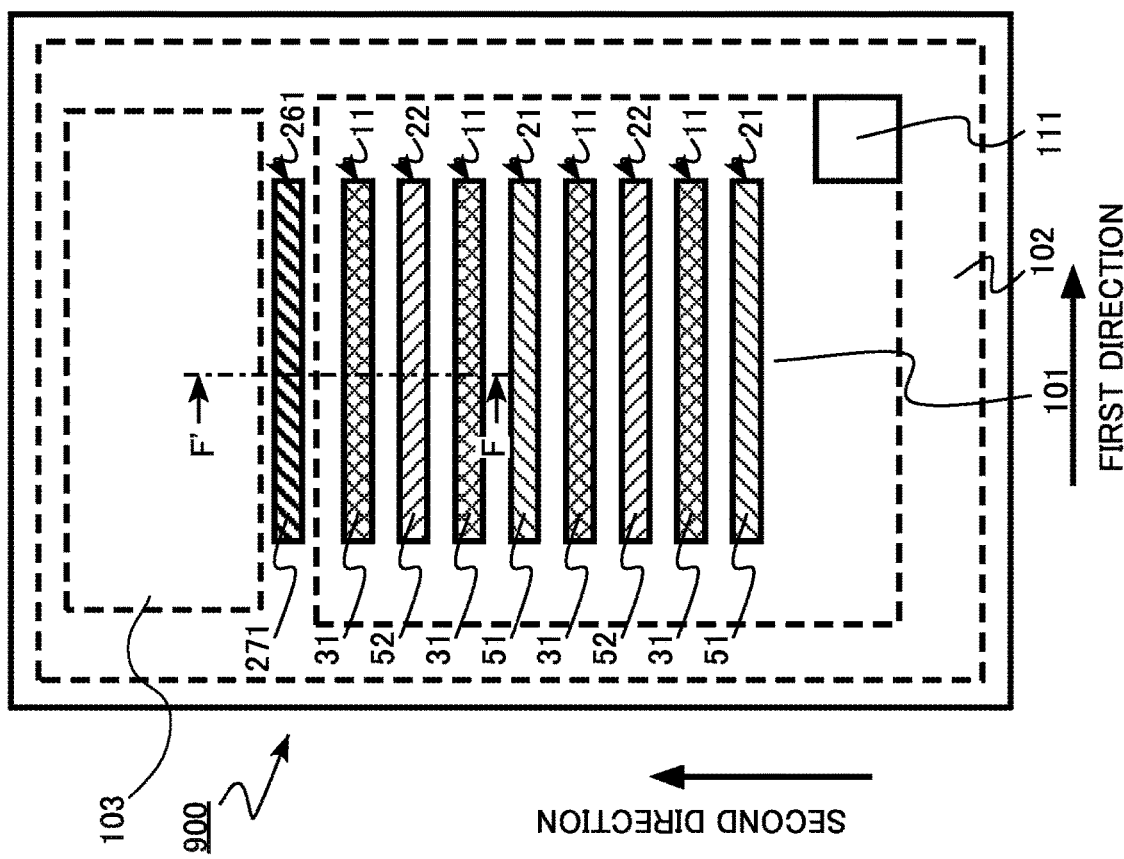

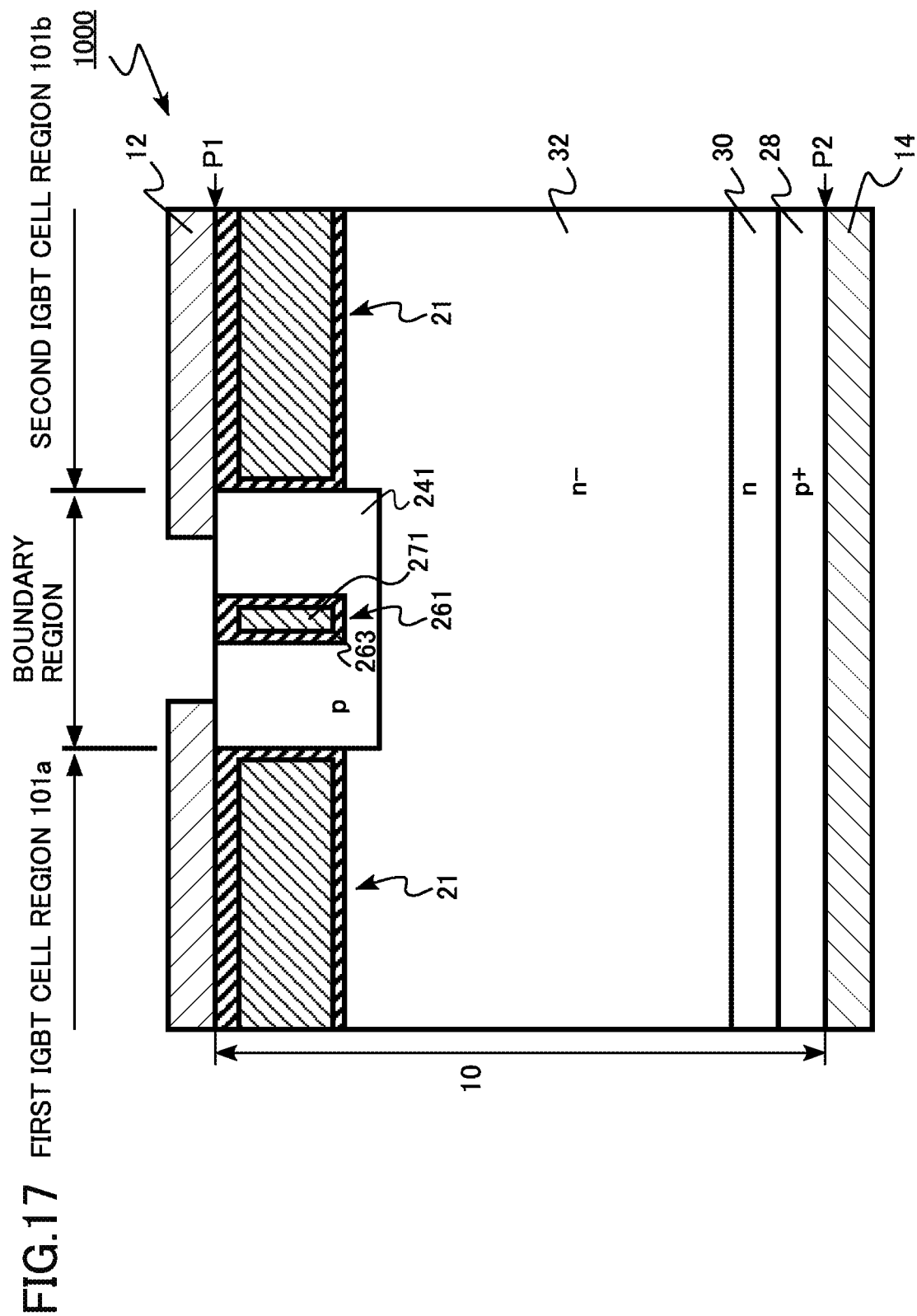

SEMICONDUCTOR DEVICE

CROSS-REFERENCE TO RELATED APPLICATION

This application is based upon and claims the benefit of priority from Japanese Patent Application No. 2018-055860, filed on Mar. 23, 2018, the entire contents of which are incorporated herein by reference.

FIELD

Embodiments described herein relate generally to semiconductor devices.

BACKGROUND

An insulated gate bipolar transistor (IGBT) is one example of a power semiconductor device. In the IGBT, for example, a p-type collector region, an n-type drift region, and a p-type base region are provided on a collector electrode. And, a gate electrode is provided in a trench that penetrates through the p-type base region and reaches the n-type drift region, with agate insulating film interposed between the gate electrode and the trench. In addition, an n-type emitter region connected to an emitter electrode is provided in a region that is adjacent to the trench in the surface of the p-type base region.

In the IGBT, a positive voltage higher than a threshold voltage is applied to the gate electrode to form a channel in the p-type base region. Then, holes are injected from the collector region to the n-type drift region at the same time as electrons are injected from the n-type emitter region to the n-type drift region. Then, a current having the electrons and the holes as carriers flows between the collector electrode and the emitter electrode.

It is effective to increase the carrier concentration of the n-type drift region in a state in which the IGBT is turned on in order to reduce the on-resistance of the IGBT. In contrast, in a case when the IGBT is turned off, if the discharge of carriers in the n-type drift region is delayed, the turn-off time increases and switching loss increases. Double gate driving has been proposed as a method for reducing both on-resistance and switching loss. The double gate driving is a technique in which two gate driving systems are provided and the driving timing of two gates is changed to reduce the switching time and the switching loss of an IGBT. Therefore, it is possible to reduce both on-resistance and switching loss.

BRIEF DESCRIPTION OF THE DRAWINGS

FIGS. 1A and 1B are plan views schematically illustrating a semiconductor device according to a first embodiment;

FIGS. 6A and 6B are plan views schematically illustrating a semiconductor device according to a fifth embodiment;

FIGS. 8A and 8B are plan views schematically illustrating a semiconductor device according to a sixth embodiment;

FIGS. 13A and 13B are plan views schematically illustrating a semiconductor device according to a ninth embodiment;

FIG. 17 is a cross-sectional view schematically illustrating the semiconductor device according to the tenth embodiment.

DETAILED DESCRIPTION

Figure 2:
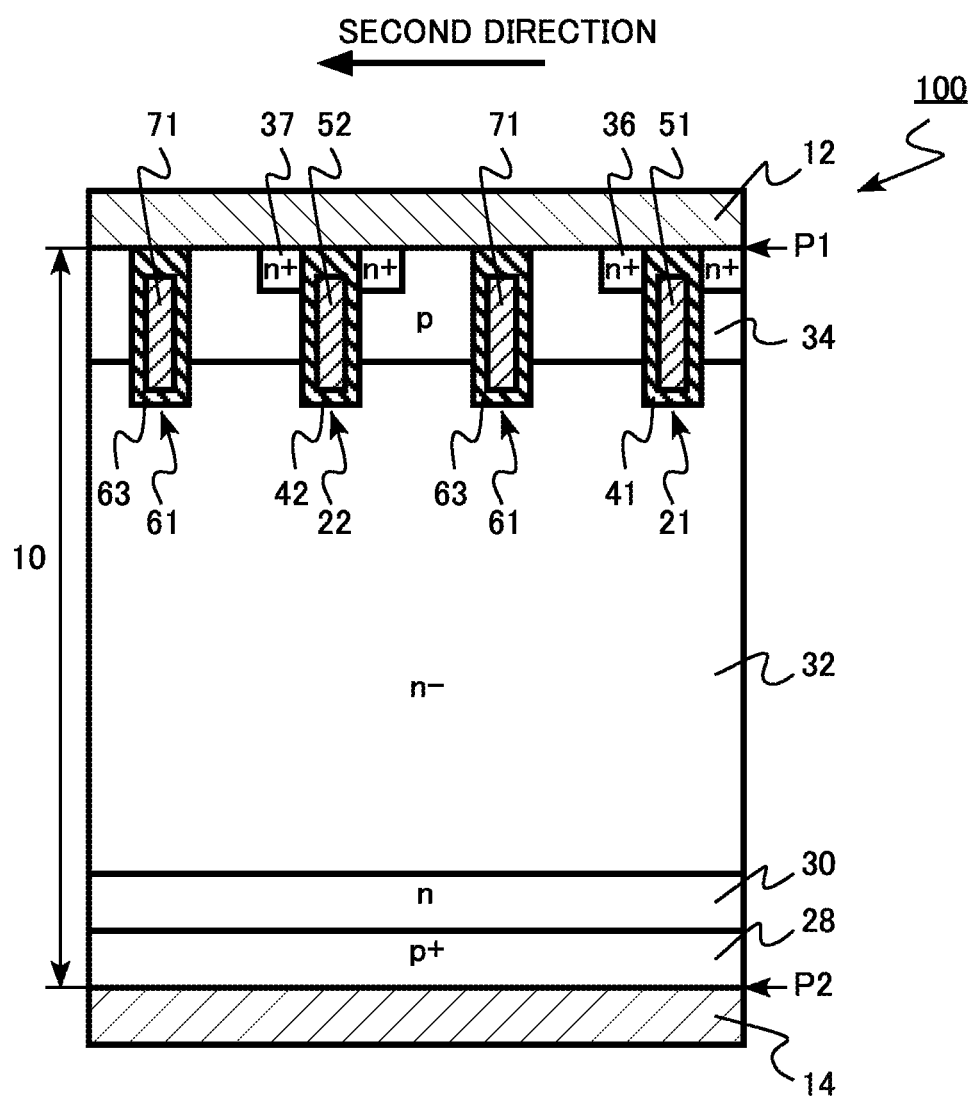
FIG. 2 is a cross-sectional view schematically illustrating the semiconductor device according to the first embodiment.

A semiconductor device according to an embodiment includes: a semiconductor layer having a first plane and a second plane opposite to the first plane; a first trench provided in the semiconductor layer, the first trench extending in a first direction parallel to the first plane in the first plane; a first gate electrode provided in the first trench; a second trench provided in the semiconductor layer, the second trench extending in the first direction in the first plane; a second gate electrode provided in the second trench; a third trench provided in the semiconductor layer; a first resistive layer provided in the third trench; a first electrode provided on a side of the first plane of the semiconductor layer; a second electrode provided on a side of the second plane of the semiconductor layer; and a gate electrode pad provided on the side of the first plane of the semiconductor layer, the gate electrode pad being electrically connected to the first gate electrode through the first resistive layer, the gate electrode pad being electrically connected to the second gate electrode.

Hereinafter, embodiments of the invention will be described with reference to the drawings. In the following description, for example, the seine parts are denoted by the same reference numerals and the description of the parts that have been described once will not be repeated.

In the specification, in a case in which conductivity types are represented by $n^+$, n, and $n^-$, $n^+$ indicates the highest n-type impurity concentration, followed by n and $n^-$. In addition, in a case in which conductivity types are represented by $p^+$, p, and $p^-$, $p^+$ indicates the highest p-type impurity concentration, followed by p and $p^-$.

In the specification, the term "depth" is defined as a depth in a direction from a first plane P1 to a second plane P2.

First Embodiment

A semiconductor device according to a first embodiment includes: a semiconductor layer having a first plane and a second plane opposite to the first plane; a first trench provided in the semiconductor layer, the first trench extending in a first direction parallel to the first plane in the first plane; a first gate electrode provided in the first trench; a second trench provided in the semiconductor layer, the second trench extending in the first direction in the first plane; a second gate electrode provided in the second trench; a third trench provided in the semiconductor layer; a first resistive layer provided in the third trench; an emitter electrode provided on a side of the first plane of the semiconductor layer; a collector electrode provided on a side of the second plane of the semiconductor layer; and a gate electrode pad provided on the first plane of the semiconductor layer, the gate electrode pad being electrically connected to the first gate electrode through the first resistive layer, the gate electrode pad being electrically connected to the second gate electrode.

FIGS. 1A and 1B are plan views schematically illustrating the semiconductor device according to the first embodiment. FIG. 1A is a pattern layout diagram and FIG. 1B is a diagram in which an electrical connection relationship between patterns is added to FIG. 1A. FIG. 2 is a cross-sectional view schematically illustrating the semiconductor device according to the first embodiment. FIG. 2 is a cross-sectional view taken along the line AA' of FIG. 1A.

The semiconductor device according to the first embodiment is a trench IGBT 100 in which a gate electrode is provided in a trench formed in a semiconductor layer. The semiconductor device according to the first embodiment is a double-gate IGBT 100. Hereinafter, a case in which a first conductivity type is a p type and a second conductivity type is an n type will be described as an example.

The IGBT 100 according to the first embodiment includes an IGBT cell region 101, a termination region 102, and a gate electrode pad 111. The IGBT 100 includes a semiconductor layer 10, an emitter electrode 12 (first electrode), and a collector electrode 14 (second electrode).

A transistor is provided in the IGBT cell region 101. The IGBT cell region 101 has a main function of making an on-current of the IGBT 100 flow. The termination region 102 surrounds the IGBT cell region 101. The termination region 102 has a function of preventing a lowering of the breakdown voltage of the IGBT 100 in a case in which the IGBT 100 is turned off, that is, a reverse bias is applied.

The semiconductor layer 10 includes a first gate trench 21 (first trench), a second gate trench 22 (second trench), a first gate electrode 51, a second gate electrode 52, a p-type collector region 28 (first semiconductor region), an n-type buffer region 30, an n-type drift region 32 (second semiconductor region), a p-type base region 34 (third semiconductor region), a first n-type emitter region 36 (fourth semiconductor region), a second n-type emitter region 37 (fifth semiconductor region), a first gate insulating film 41, a second gate insulating film 42, a resistive trench 61 (third trench), a first resistive layer 71, and an insulating film 63.

The semiconductor layer 10 has a first plane P1 and a second plane P2 opposite to the first plane P1. The semiconductor layer 10 is made of, for example, single-crystal silicon. The thickness of the semiconductor layer 10 is, for example, equal to or greater than 40 μm and equal to or less than 700 μm.

The emitter electrode 12 is provided on a side of the first plane P1 of the semiconductor layer 10. The emitter electrode 12 covers, for example, the entire IGBT cell region 101. At least a portion of the emitter electrode 12 contacts the first plane P1 of the semiconductor layer 10. The emitter electrode 12 is made of, for example, metal. An emitter voltage is applied to the emitter electrode 12. The emitter voltage is, for example, 0 V.

The collector electrode 14 is provided on a side of the second plane P2 of the semiconductor layer 10. At least a portion of the collector electrode 14 contacts the second plane 92 of the semiconductor layer 10. The collector electrode 14 is made of, for example, metal. A collector voltage is applied to the collector electrode 14. The collector voltage is, for example, equal to or greater than 200 V and equal to or less than 6500 V.

The p-type collector region 28 is a $p^+$ semiconductor region. The p-type collector region 28 is electrically connected to the collector electrode 14. The p-type collector region 28 contacts the collector electrode 14.

The p-type collector region 28 is a hole supply source in a case in which the IGBT 100 is in an on state.

The n-type buffer region 30 is an n-type semiconductor region. The n-type buffer region 30 is provided between the first plane P1 and the p-type collector region 28. The n-type buffer region 30 has a function of preventing the spread of a depletion layer in a case in which the IGBT 100 is in an off state. The n-type buffer region 30 may not be provided.

The n-type drift region 32 is an $n^-$ semiconductor region. The n-type drift region 32 is provided between the first plane P1 and the n-type buffer region 30. The n-type impurity concentration of the n-type drift region 32 is lower than the n-type impurity concentration of the n-type buffer region 30.

The n-type drift region 32 is the path of an on-current in a case in which the IGBT 100 is in the on state. The n-type drift region 32 has a function of being depleted to maintain the breakdown voltage of the IGBT 100 in a case in which the IGBT 100 is in the off state.

The p-type base region 34 is a p-type semiconductor region. The p-type base region 34 is provided between the first plane P1 and the n-type drift region 32. The depth of the p-type base region 34 in a direction from the first plane P1 to the second plane 92 is, for example, equal to or less than 6 μm. An inversion layer is formed in the p-type base region 34 in a case in which the IGBT 100 is in an on state and the p-type base region 34 functions as a channel region of the transistor.

An n barrier layer (not illustrated) may be provided between the n-type drift region 32 and the p-type base region 34. The n-type impurity concentration of the n barrier layer is higher than the n-type impurity concentration of the n-type drift region 32. The n barrier layer is provided so as to be closer to the p-type base region 34 than a lower end of the first gate trench 21. In other words, the n barrier layer is shallower than the lower end of the first gate trench 21.

The first n-type emitter region 36 is an $n^+$ semiconductor region. The first n-type emitter region 36 is provided between the first plane P1 and the p-type base region 34. The n-type impurity concentration of the first n-type emitter region 36 is higher than the n-type impurity concentration of the n-type drift region 32.

The first n-type emitter region 36 is electrically connected to the emitter electrode 12. The first n-type emitter region 36 contacts the emitter electrode 12. The first n-type emitter region 36 functions as an electron supply source in a case in which the transistor having the first gate electrode 51 is in an on state.

The second n-type emitter region 37 is an $n^-$ semiconductor region. The second n-type emitter region 37 is provided between the first plane P1 and the p-type base region 34. The n-type impurity concentration of the second n-type emitter region 37 is higher than the n-type impurity concentration of the n-type drift region 32.

The second n-type emitter region 37 is electrically connected to the emitter electrode 12. The second n-type emitter region 37 contacts the emitter electrode 12. The second n-type emitter region 37 functions as an electron supply source in a case in which the transistor having the second gate electrode 52 is in an on state.

FIG. 1A illustrates the layout pattern of the first gate trench 21, the second gate trench 22, the resistive trench 61, the first gate electrode 51, the second gate electrode 52, the first resistive layer 71, and the gate electrode pad 111. In FIG. 1A, the layout pattern of the emitter electrode 12 is not illustrated.

The first gate trench 21 is provided in the IGBT cell region 101. The first gate trench 21 extends in the first direction parallel to the first plane P1 in the first plane P1. The first gate trench 21 has a stripe shape. A plural of first gate trenches 21 are repeatedly arranged in a second direction perpendicular to the first direction.

The first gate trench 21 penetrates through the first n-type emitter region 36 and the p-type base region 34. The depth of the first gate trench 21 is, for example, equal to or less than 6 μm.

The first gate electrode 51 is provided in the first gate trench 21. The first gate electrode 51 is made of, for example, a semiconductor or metal. The first gate electrode 51 is made of, for example, amorphous silicon or polysilicon including n-type impurities or p-type impurities. The first gate electrode 51 is electrically connected to the gate electrode pad 111.

The first gate insulating film 41 is provided between the first gate electrode 51 and the p-type base region 34. The first gate insulating film 41 is, for example, a silicon oxide film.

The second gate trench 22 is provided in the IGBT cell region 101. The second gate trench 22 extends in the first direction parallel to the first plane P1 in the first plane P1. The second gate trench 22 has a stripe shape. The second gate trenches 22 are repeatedly arranged in the second direction perpendicular to the first direction.

The second gate trench 22 penetrates through the p-type base region 34. The depth of the second gate trench 22 is, for example, equal to or greater than 4 μm and equal to or less than 6 μm.

For example, the second gate trench 22 has the same shape as the first gate trench 21.

The second gate electrode 52 is provided in the second gate trench 22. The second gate electrode 52 is made of, for example, a semiconductor or metal. The second gate electrode 52 is made of, for example, amorphous silicon or polysilicon including n-type impurities or p-type impurities. The second gate electrode 52 is electrically connected to the gate electrode pad 111.

The second gate insulating film 42 is provided between the second gate electrode 52 and the p-type base region 34. The second gate insulating film 42 is, for example, a silicon oxide film.

The resistive trench 61 is provided in the IGBT cell region 101. The resistive trench 61 is provided between the first gate trench 21 and the second gate trench 22. The resistive trench 61 extends in the first direction parallel to the first plane P1 in the first plane P1. The resistive trench 61 has a stripe shape. The resistive trenches 61 are repeatedly arranged in the second direction perpendicular to the first direction.

The resistive trench 61 penetrates through the p-type base region 34. The depth of the resistive trench 61 is, for example, equal to or less than 6 μm.

For example, the resistive trench 61 has the same shape as the first gate trench 21 and the second gate trench 22.

The first resistive layer 71 is provided in the resistive trench 61. The first resistive layer 71 is made of, for example, a semiconductor or metal. The first resistive layer 71 is made of, for example, amorphous silicon or polysilicon including n-type impurities or p-type impurities. The first resistive layer 71 is electrically connected to the gate electrode pad 111.

For example, the electrical resistivity of the first resistive layer 71 is higher than the electrical resistivity of the first gate electrode 51 and the electrical resistivity of the second gate electrode 52. For example, the first resistive layer 71, the first gate electrode 51, and the second gate electrode 52 are made of amorphous silicon or polysilicon including n-type impurities or p-type impurities. For example, the conductive impurity concentration of the first resistive layer 71 is lower than the conductive impurity concentration of the first gate electrode 51 and the conductive impurity concentration of the second gate electrode 52.

The first resistive layer 71 functions as the gate resistance of the first gate electrode 51.

The insulating film 63 is provided between the first resistive layer 71 and the p-type base region 34. The insulating film 63 is, for example, a silicon oxide film.

The gate electrode pad 111 is provided on the first plane P1 of the semiconductor layer 10. The gate electrode pad 111 is electrically connected to the first gate electrode 51 through the first resistive layer 71. For example, as illustrated in FIG. 1B, the gate electrode pad 111 is electrically connected to the first gate electrode 51 through the first resistive layers 71 in two resistive trenches 61 which are connected in series.

The gate electrode pad 111 is electrically connected to the second gate electrode 52. The first resistive layer 71 is not interposed between the gate electrode pad 111 and the second gate electrode 52.

For example, the gate electrode pad 111, the first resistive layer 71, the first gate electrode 51, and the second gate electrode 52 are connected to each other by metal wires (not illustrated).

A turn-on voltage or a turn-off voltage is applied to the gate electrode pad 111. The turn-on voltage is higher than a threshold voltage of the transistor in the cell region 101. The turn-on voltage is, for example, 15 V. The turn-off voltage is equal to or less than the threshold voltage at which the transistor in the cell region 101 is not turned on and is, for example, 0 V.

Next, the operation of the IGBT 100 will be described. In the actual structure, the transistor having the first gate electrode 51 is not clearly separated from the transistor having the second gate electrode 52. However, for convenience of description of the operation, it is assumed that the transistor having the first gate electrode 51 and the transistor having the second gate electrode 52 are separated from each other.

In a case in which the IGBT 100 is in the off state, for example, the emitter voltage is applied to the emitter electrode 12. The emitter voltage is, for example, 0 V. The collector voltage is applied to the collector electrode 14. The collector voltage is, for example, equal to or greater than 200 V and equal to or less than 6500 V.

In a case in which the IGBT 100 is in an off state, the turn-off voltage is applied to the gate electrode pad 111. Therefore, the turn-off voltage is also applied to the first gate electrode 51 and the second gate electrode 52. The turn-off voltage is equal to or less than the threshold voltage at which the transistor in the cell region 101 is not turned on and is, for example, 0 V.

In a case in which the IGBT 100 is turned on, the turn-on voltage is applied to the gate electrode pad 111. The turn-on voltage is also applied to the first gate electrode 51 and the second gate electrode 52.

The turn-on voltage is higher than the threshold voltage of the transistor in the cell region 101. The turn-on voltage is, for example, 15 V. Both the transistor having the first gate electrode 51 and the transistor having the second gate electrode 52 in the cell region 101 are turned on.

In a case in which the IGBT 100 is turned off, the turn-off voltage is applied to the gate electrode pad 111. At that time, the gate resistance of the first gate electrode 51 is higher than the gate resistance of the second gate electrode 52 since the first resistive layer 71 is connected to the gate electrode pad 111. Therefore, a change in the potential of the first gate electrode 51 is delayed with respect to a change in the potential of the second gate electrode 52. As a result, the transistor having the second gate electrode 52 is turned off before the transistor having the first gate electrode 51 is turned off.

Since the transistor having the second gate electrode 52 is turned off, the number of electrons injected from the emitter electrode 12 to the n-type drift region 32 is reduced. Therefore, the number of carriers accumulated in the n-type drift region 32 is reduced.

Then, the transistor having the first gate electrode 51 whose potential change has been delayed is turned off and the IGBT 100 is turned off. At that time, since the number of carriers accumulated in the n-type drift region 32 has already been reduced, the turn-off time is reduced and switching loss is prevented.

Next, the function and effect of the semiconductor device according to the first embodiment will be described.

It is effective to increase the carrier concentration of the n-type drift region in a state in which the IGBT is turned on in order to reduce the on-resistance of the IGBT. In contrast, in a case in which the IGBT is turned off, if the discharge of carriers from the n-type drift region is delayed, the turn-off time increases and switching loss increases. Double gate driving has been proposed as a method for reducing both on-resistance and switching loss. In the double gate driving, two gate driving systems are used and the driving timing of two gates is changed to reduce the switching time of the IGBT. Therefore, it is possible to reduce both on-resistance and switching loss.

However, it is necessary to provide two gate electrode pads in an IGBT chip and to provide two connection systems from the gate electrode pads to the outside, in order to achieve the double gate driving of the IGBT. Therefore, this imposes a large burden on the user of the IGBT.

In the IGBT 100 according to the first embodiment, the first resistive layer 71 provided in the chip is used as the gate resistance of the first gate electrode 51. The use of the first resistive layer 71 makes it possible to delay a change in the potential of the first gate electrode 51 with respect to a change in the potential of the second gate electrode 52. Therefore, it is possible to achieve the double gate driving of the IGBT, without providing two gate electrode pads in the IGBT chip.

In the IGBT 100 according to the first embodiment, the n-type emitter region is not provided so as to be adjacent to the resistive trench 61. Therefore, the first resistive layer 71 provided in the resistive trench 61 does not function as the gate electrode of the transistor even in a case in which the turn-on voltage is applied. The IGBT 100 according to the first embodiment has the structure in which the trench that does not electrically connect the emitter electrode and the n drift layer is provided in the IGBT cell region 101.

In the IGBT 100 according to the first embodiment, the trench that does not electrically connect the emitter electrode and the n drift layer and is provided in order to improve the characteristics of the IGBT 100, for example, to reduce loss is effectively used for double gate driving. In other words, it is possible to provide the gate resistance of the first gate electrode 51 in the chip, without increasing an area penalty.

It is preferable that the electrical resistivity of the first resistive layer 71 be higher than the electrical resistivity of the first gate electrode 51 and the electrical resistivity of the second gate electrode 52 in order to increase the gate resistance connected to the first gate electrode 51. Preferably, the first resistive layer 71, the first gate electrode 51, and the second gate electrode 52 are made of amorphous silicon or polysilicon including n-type impurities or p-type impurities and the conductive impurity concentration of the first resistive layer 71 is lower than the conductive impurity concentration of the first gate electrode 51 and the conductive impurity concentration of the second gate electrode 52.

In the IGBT 100 according to the first embodiment, the first resistive layers 71 provided in two resistive trenches 61 are connected in series. However, only the first resistive layer 71 in one resistive trench 61 may be connected to the first gate electrode 51 according to a necessary gate resistance value. The first resistive layers 71 provided in three or more resistive trenches 61 may be connected in series. Alternatively, the first resistive layers 71 provided in two resistive trenches 61 may be connected in parallel.

As described above, according to the first embodiment, double gate driving can be achieved by one gate electrode pad.

Second Embodiment

A semiconductor device according to a second embodiment differs from the semiconductor device according to the first embodiment in that the insulating film that is provided between the first resistive layer and the semiconductor layer has a larger thickness than the first gate insulating film and the second gate insulating film. In addition, the semiconductor device according to the second embodiment differs from the semiconductor device according to the first embodiment in that the width of the first resistive layer in the second direction perpendicular to the first direction is less than the width of the first gate electrode and the second gate electrode in the second direction. Hereinafter, the description of the same content as that in the first embodiment will not be repeated.

Figure 3:
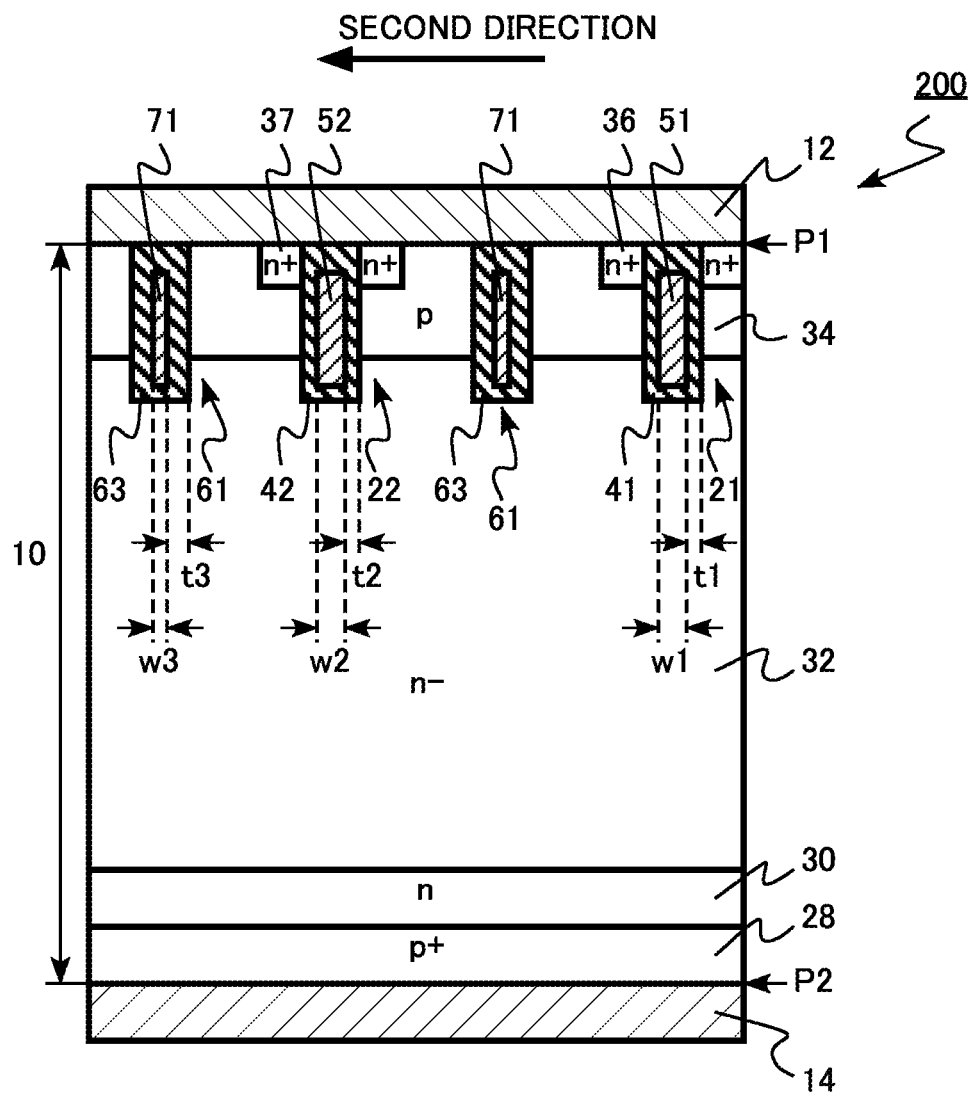
FIG. 3 is a cross-sectional view schematically illustrating a semiconductor device according to a second embodiment.

FIG. 3 is a cross-sectional view schematically illustrating the semiconductor device according to the second embodiment. FIG. 3 is a cross-sectional view corresponding to the cross-sectional view taken along the line AA' of FIG. 1A.

The semiconductor device according to the second embodiment is a trench IGBT 200 in which a gate electrode is provided in a trench formed in a semiconductor layer. The semiconductor device according to the second embodiment is a double-gate IGBT 200.

The thickness (t3 in FIG. 3) of the insulating film 63 provided between the first resistive layer 71 and the semiconductor layer 10 is greater than the thickness (t1 in FIG. 3) of the first gate insulating film 41 provided between the first gate electrode 51 and the semiconductor layer 10. In addition, the thickness t3 of the insulating film 63 is greater than the thickness (t2 in FIG. 3) of the second gate insulating film 42 provided between the first gate electrode 51 and the semiconductor layer 10.

The width (w3 in FIG. 3) of the first resistive layer 71 in the second direction perpendicular to the first direction is less than the width (w1 in FIG. 3) of the first gate electrode 51 in the second direction. In addition, the width w3 of the first resistive layer 71 in the second direction is less than the width w2 of the second gate electrode 52 in the second direction.

In the IGBT 200 according to the second embodiment, the thickness t3 of the insulating film 63 is large. Therefore, even in a case in which a turn-on voltage is applied to the first resistive layer 71, an inversion layer is not formed on the side of the resistive trench 61 in the p-type base region 34. Therefore, the operation of the IGBT 200 is stabilized.

In addition, in the IGBT 200 according to the second embodiment, since the thickness t3 of the insulating film 63 is large, gate capacity is reduced. Therefore, the turn-off time of the IGBT 200 is reduced and switching loss is reduced.

Furthermore, in the IGBT 200 according to the second embodiment, since the width w3 of the first resistive layer 71 is reduced, it is possible to increase the resistance of the first resistive layer 71. Therefore, it is possible to achieve a high gate resistance.

As described above, according to the second embodiment, double gate driving can be achieved by one gate electrode pad. In addition, the operation of the IGBT 200 is stabilized and the turn-off time is reduced. Furthermore, it is possible to achieve a high gate resistance.

Third Embodiment

A semiconductor device according to a third embodiment differs from the semiconductor device according to the first embodiment in that the p-type base region is not provided on the side of the third trench. Hereinafter, the description of the same content as that in the first embodiment will not be repeated.

Figure 4:
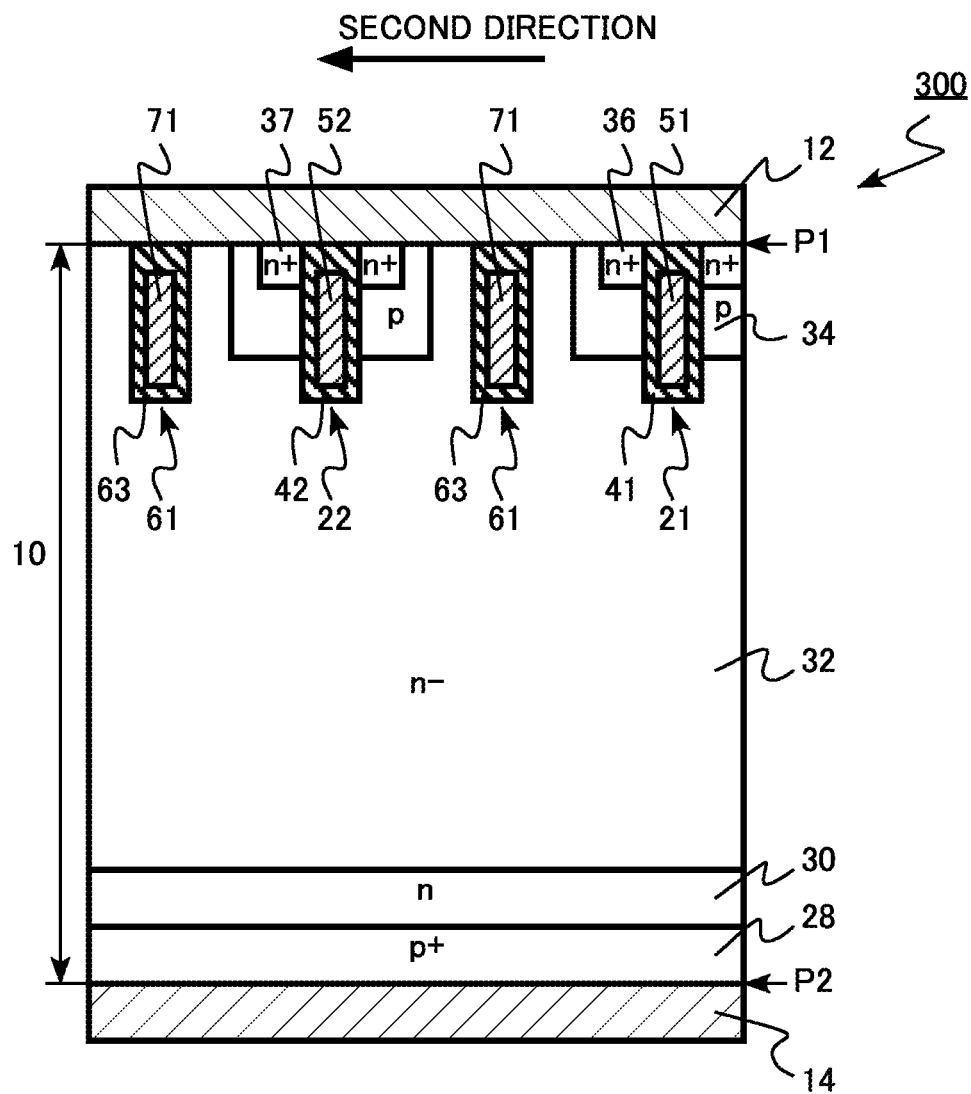
FIG. 4 is a cross-sectional view schematically illustrating a semiconductor device according to a third embodiment.

FIG. 4 is a cross-sectional view schematically illustrating the semiconductor device according to the third embodiment. FIG. 4 is a cross-sectional view corresponding to the cross-sectional view taken along the line AA' of FIG. 1A.

The semiconductor device according to the third embodiment is a trench IGBT 300 in which a gate electrode is provided in a trench formed in a semiconductor layer. The semiconductor device according to the third embodiment is a double-gate IGBT 300.

In the IGBT 300, the p-type base region 34 is not provided on the side of the resistive trench 61 (third trench). The resistive trench 61 does not penetrate through the p-type base region 34. The resistive trench 61 is in the n-type drift region 32.

In the IGBT 300 according to the third embodiment, the p-type base region 34 is not provided on the side of the resistive trench 61. Therefore, even in a case in which the turn-on voltage is applied to the first resistive layer 71, an inversion layer is not formed on the side of the resistive trench 61. As a result, the operation of the IGBT 300 is stabilized.

As described above, according to the third embodiment, double gate driving can be achieved by one gate electrode pad. In addition, the operation of the IGBT 300 is stabilized.

Fourth Embodiment

A semiconductor device according to a fourth embodiment differs from the semiconductor device according to the first embodiment in that the depth of the p-type base region below the third trench is greater than the depth of the third trench. Hereinafter, the description of the same content as that in the first embodiment will not be repeated.

Figure 5:
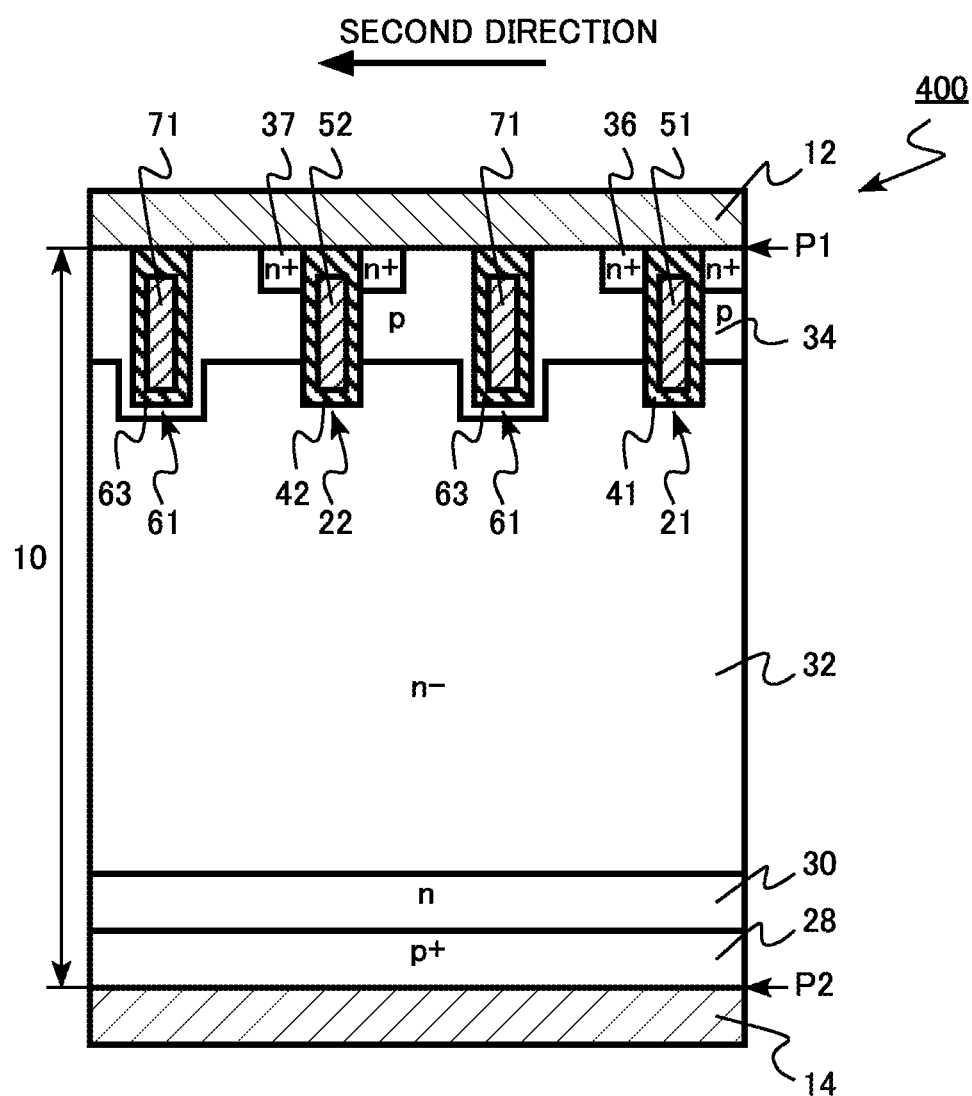
FIG. 5 is a cross-sectional view schematically illustrating a semiconductor device according to a fourth embodiment.

FIG. 5 is a cross-sectional view schematically illustrating the semiconductor device according to the fourth embodiment. FIG. 5 is a cross-sectional view corresponding to the cross-sectional view taken along the line AA' of FIG. 1A.

The semiconductor device according to the fourth embodiment is a trench IGBT 400 in which a gate electrode is provided in a trench formed in a semiconductor layer. The semiconductor device according to the fourth embodiment is a double-gate IGBT 400.

In the IGBT 400, the depth of the p-type base region 34 below the resistive trench 61 (third trench) is greater than the depth of the resistive trench 61. The resistive trench 61 does not penetrate through the p-type base region 34. The bottom of the resistive trench 61 is in the p-type base region 34.

In the IGBT 400 according to the fourth embodiment, the bottom of the resistive trench 61 is in the p-type base region 34. An inversion layer is formed on the side of the trench in a state in which the IGBT 400 is in an on state. However, the inversion layer does not extend to the n-type drift region 32 and does not contribute to the transmission of carriers. Therefore, the inversion layer does not have an effect on the operation of the IGBT 400.

As described above, according to the fourth embodiment, double gate driving can be achieved by one gate electrode pad. In addition, the on-resistance of the IGBT 400 is reduced.

Fifth Embodiment

A semiconductor device according to a fifth embodiment differs from the semiconductor device according to the first embodiment in that it further includes a fourth trench that is provided between the third trench and the second trench and extends in the first direction in the first plane and a second resistive layer provided in the fourth trench and the gate electrode pad is interposed between the first resistive layer and the second resistive layer and is electrically connected to the first gate electrode. Hereinafter, the description of the same content as that in the first embodiment will not be repeated.

Figure 7:
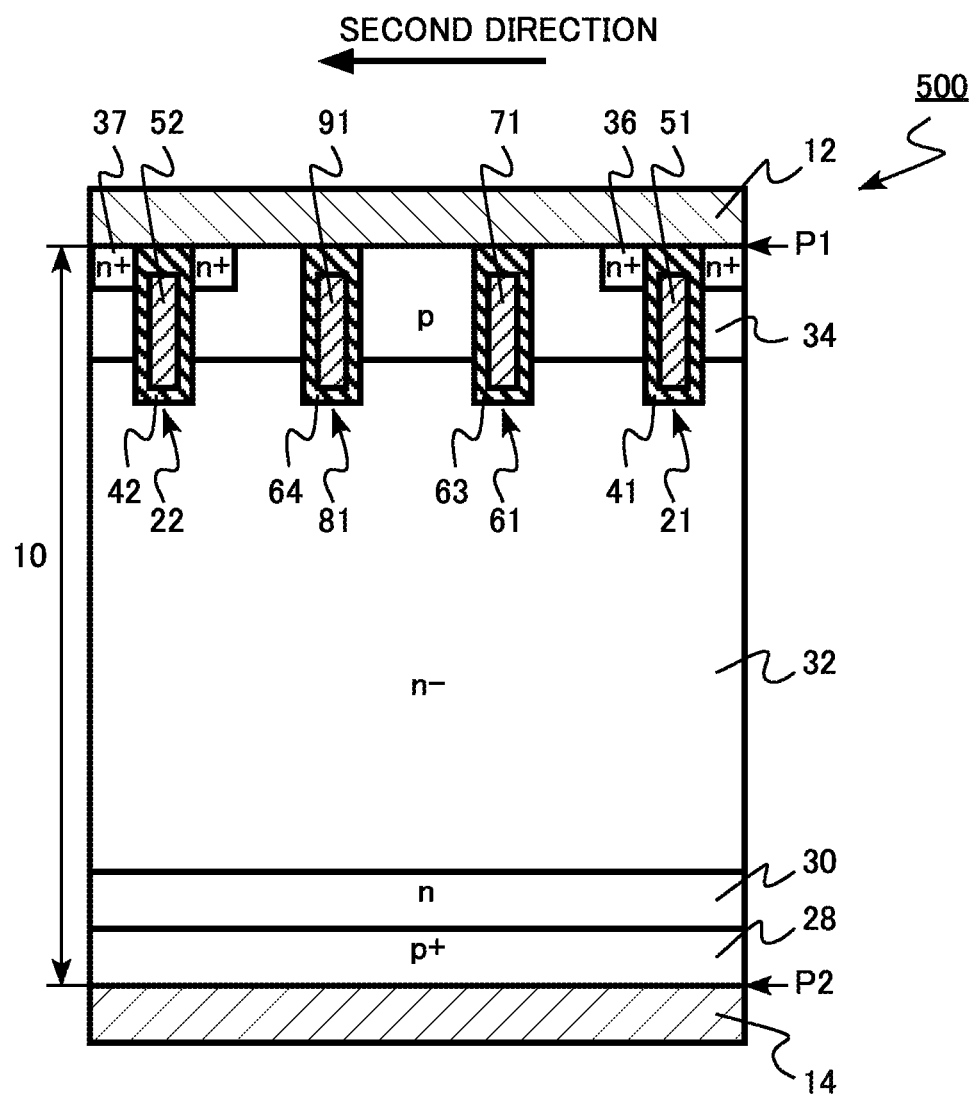
FIG. 7 is a cross-sectional view schematically illustrating the semiconductor device according to the fifth embodiment.

FIGS. 6A and 6B are plan views schematically illustrating the semiconductor device according to the fifth embodiment. FIG. 6A is a pattern layout diagram and FIG. 6B is a diagram in which an electrical connection relationship between patterns is added to FIG. 6A. FIG. 7 is a cross-sectional view schematically illustrating the semiconductor device according to the fifth embodiment. FIG. 7 is a cross-sectional view taken along the line BB' of FIG. 6A.

The semiconductor device according to the fifth embodiment is a trench IGBT 500 in which a gate electrode is provided in a trench formed in a semiconductor layer. The semiconductor device according to the fifth embodiment is a double-gate IGBT 500.

The IGBT 500 includes a resistive trench 81 (fourth trench) provided between the resistive trench 61 (third trench) and the second gate trench 22 (second trench).

The resistive trench 81 is provided in the IGBT cell region 101. The resistive trench 81 is provided between the first gate trench 21 and the second gate trench 22. The resistive trench 81 extends in the first direction parallel to the first plane P1 in the first plane P1. The resistive trench 81 has a stripe shape. The resistive trenches 81 are repeatedly arranged in the second direction perpendicular to the first direction.

The first gate trench 21, the restive trench 61, the resistive trench 81, and the second gate trench 22 are arranged in this order in the second direction.

The resistive trench 81 penetrates through the p-type base region 34. The depth of the resistive trench 81 in the direction from the first plane P1 to the second plane 92 is, for example, equal to or less than 6 μm.

For example, the resistive trench 81 has substantially the same shape as the first gate trench 21, the second gate trench 22, and the resistive trench 61.

A second resistive layer 91 is provided in the resistive trench 81. The second resistive layer 91 is made of, for example, a semiconductor or metal. The second resistive layer 91 is made of, for example, amorphous silicon or polysilicon including n-type impurities or p-type impurities. The second resistive layer 91 is electrically connected to the gate electrode pad 111.

For example, the electrical resistivity of the second resistive layer 91 is higher than the electrical resistivity of the first gate electrode 51 and the electrical resistivity of the second gate electrode 52. For example, the second resistive layer 91, the first gate electrode 51, and the second gate electrode 52 are made of amorphous silicon or polysilicon including n-type impurities or p-type impurities. For example, the conductive impurity concentration of the second resistive layer 91 is lower than the conductive impurity concentration of the first gate electrode 51 and the conductive impurity concentration of the second gate electrode 52.

The second resistive layer 91 functions as the gate resistance of the first gate electrode 51.

An insulating film 64 is provided between the second resistive layer 91 and the p-type base region 34. The insulating film 64 is, for example, a silicon oxide film.

The gate electrode pad 111 is provided on the first plane P1 of the semiconductor layer 10. As illustrated in FIG. 6B, the first gate electrode pad 111 is electrically connected to the first gate electrode 51 through the first resistive layer 71 and the second resistive layer 91 connected in parallel to each other.

The gate electrode pad 111 is electrically connected to the second gate electrode 52. The first resistive layer 71 and the second resistive layer 91 are not interposed between the first gate electrode pad 111 and the second gate electrode 52.

The gate electrode pad 111, the first resistive layer 71, the second resistive layer 91, the first gate electrode 51, and the second gate electrode 52 are connected to each other by, for example, metal wires (not illustrated).

The IGBT 500 according to the fifth embodiment is provided with two resistive layers, that is, the first resistive layer 71 and the second resistive layer 91. Therefore, flexibility in the value of the gate resistance connected to the first gate electrode 51 increases.

As described above, according to the fifth embodiment, double gate driving can be achieved by one gate electrode pad. In addition, flexibility in the value of the gate resistance increases.

Sixth Embodiment

A semiconductor device according to a sixth embodiment includes: a semiconductor layer having a first plane and a second plane opposite to the first plane; a first trench provided in the semiconductor layer, the first trench extending in a first direction parallel to the first plane in the first plane; an upper gate electrode provided in the first trench; a lower gate electrode provided in the first trench, the lower gate electrode provided between the upper gate electrode and the second plane; a second trench provided in the semiconductor layer; a resistive layer provided in the second trench; a first electrode provided on a side of the first plane of the semiconductor layer; a second electrode provided on a side of the second plane of the semiconductor layer; and a gate electrode pad provided on the side of the first plane of the semiconductor layer, the gate electrode pad being electrically connected to the upper gate electrode through the resistive layer, the gate electrode pad being electrically connected to the lower gate electrode.

The semiconductor device according to the sixth embodiment differs from the semiconductor device according to the first embodiment in that two gate electrodes, that is, the upper gate electrode and the lower gate electrode are provided in one trench. Hereinafter, the description of the same content as that in the first embodiment will not be repeated.

Figure 9:
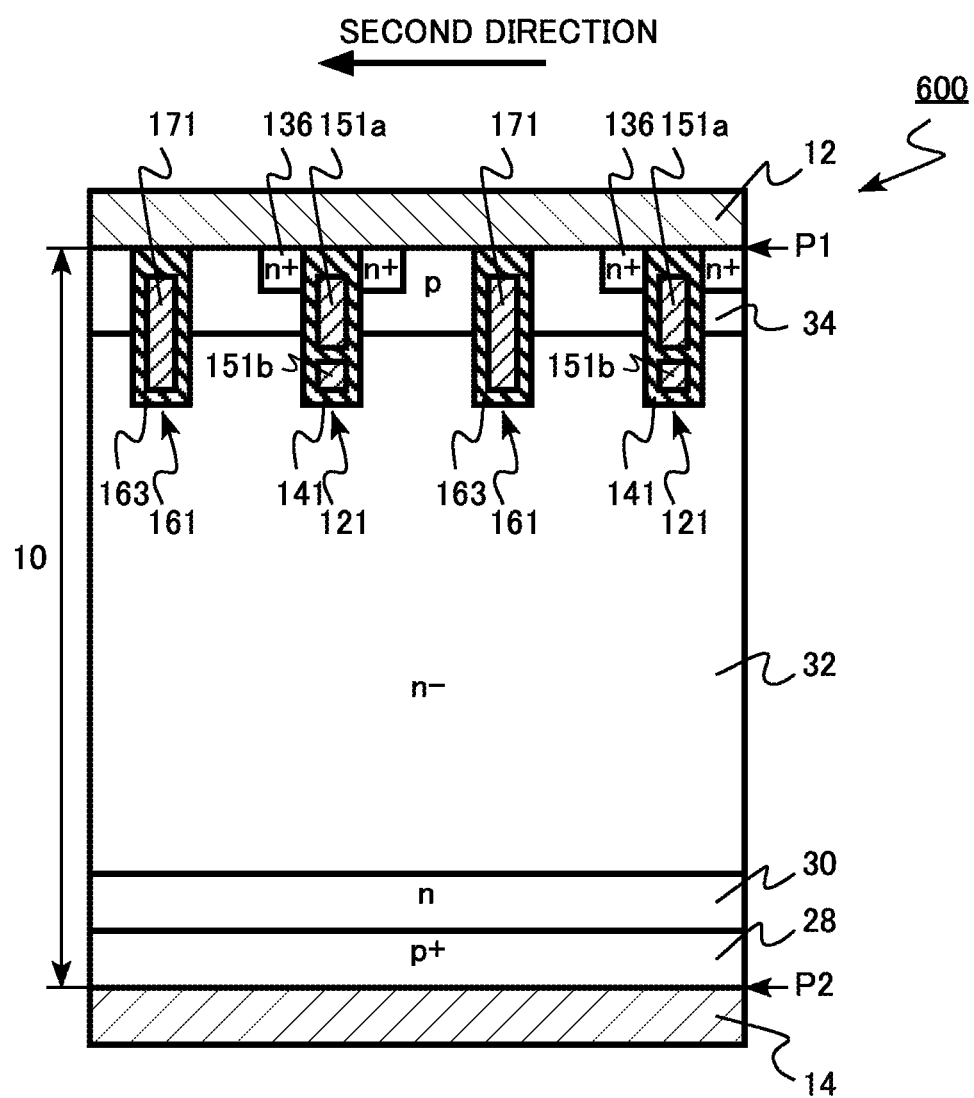
FIG. 9 is a cross-sectional view schematically illustrating the semiconductor device according to the sixth embodiment.

FIGS. 8A and 8B are plan views schematically illustrating the semiconductor device according to the sixth embodiment. FIG. 8A is a pattern layout diagram and FIG. 8B is a diagram in which an electrical connection relationship between patterns is added to FIG. 8A. FIG. 9 is a cross-sectional view schematically illustrating the semiconductor device according to the sixth embodiment. FIG. 9 is a cross-sectional view taken along the line CC' of FIG. 8A.

The semiconductor device according to the sixth embodiment is a trench IGBT 600 in which a gate electrode is provided in a trench formed in a semiconductor layer. The semiconductor device according to the sixth embodiment is a double-gate IGBT 600.

The IGBT 600 according to the sixth embodiment includes an IGBT cell region 101, a termination region 102, and a gate electrode pad 111. The IGBT 600 includes a semiconductor layer 10, an emitter electrode 12, and a collector electrode 14.

The semiconductor layer 10 includes a gate trench 121 (first trench), an upper gate electrode 151a, a lower gate electrode 151b, a p-type collector region 28, an n-type buffer region 30, an n-type drift region 32, a p-type base region 34, an n-type emitter region 136, a gate insulating film 141, a resistive trench 161 (second trench), a resistive layer 171, and an insulating film 163.

FIG. 8A illustrates the layout pattern of the gate trench 121, the resistive trench 161, the upper gate electrode 151a, the lower gate electrode 151b, the resistive layer 171, and the gate electrode pad 111. In FIG. 8A, the layout pattern of the emitter electrode 12 is not illustrated.

The gate trench 121 is provided in the IGBT cell region 101. The gate trench 121 extends in the first direction parallel to the first plane P1 in the first plane P1. The gate trench 121 has a stripe shape. A plurality of gate trenches 121 are repeatedly arranged in the second direction perpendicular to the first direction.

The gate trench 121 penetrates through the n-type emitter region 36 and the p-type base region 34. The depth of the gate trench 121 is, for example, equal to or less than 6 μm.

The upper gate electrode 151a and the lower gate electrode 151b are provided in the gate trench 121. The lower gate electrode 151b is provided between the upper gate electrode 151a and the second plane P2. The upper gate electrode 151a and the lower gate electrode 151b are electrically separated from each other.

The upper gate electrode 151a and the lower gate electrode 151b are made of, for example, a semiconductor or metal. The upper gate electrode 151a and the lower gate electrode 151b are made of, for example, amorphous silicon or polysilicon including n-type impurities or p-type impurities. The upper gate electrode 151a and the lower gate electrode 151b are electrically connected to the gate electrode pad 111.

The gate insulating film 141 is provided between the upper and lower gate electrodes 151a and 151b and the p-type base region 34. The gate insulating film 141 is, for example, a silicon oxide film.

The resistive trench 161 is provided in the IGBT cell region 101. The resistive trench 161 is provided so as to be adjacent to the gate trench 121. The resistive trench 161 extends in the first direction parallel to the first plane P1 in the first plane P1. The resistive trench 161 has a stripe shape. The resistive trenches 161 are repeatedly arranged in the second direction perpendicular to the first direction.

The resistive trench 161 penetrates through the p-type base region 34. The depth of the resistive trench 61 is, for example, equal to or less than 6 µm.

For example, the resistive trench 161 has substantially the same shape as the gate trench 121.

The resistive layer 171 is provided in the resistive trench 161. The resistive layer 171 is made of, for example, a semiconductor or metal. The resistive layer 171 is made of, for example, amorphous silicon or polysilicon including n-type impurities or p-type impurities. The resistive layer 171 is electrically connected to the gate electrode pad 111.

For example, the electrical resistivity of the resistive layer 171 is higher than the electrical resistivity of the upper gate electrode 151a and the electrical resistivity of the lower gate electrode 151b. For example, the resistive layer 171, the upper gate electrode 151a, and the lower gate electrode 151b are made of amorphous silicon or polysilicon including n-type impurities or p-type impurities. For example, the conductive impurity concentration of the resistive layer 171 is lower than the conductive impurity concentration of the upper gate electrode 151a and the conductive impurity concentration of the lower gate electrode 151b.

The resistive layer 171 functions as the gate resistance of the upper gate electrode 151a.

The insulating film 163 is provided between the resistive layer 171 and the p-type base region 34. The insulating film 163 is, for example, a silicon oxide film.

The gate electrode pad 111 is provided on a side of the first plane P1 of the semiconductor layer 10. The gate electrode pad 111 is electrically connected to the upper gate electrode 151a through the resistive layer 171. For example, as illustrated in FIG. 8B, the gate electrode pad 111 is electrically connected to the upper gate electrode 151a through the resistive layer 171 in the resistive trench 161.

The gate electrode pad 111 is electrically connected to the lower gate electrode 151b. The resistive layer 171 is not interposed between the gate electrode pad 111 and the lower gate electrode 151b.

The gate electrode pad 111, the resistive layer 171, the upper gate electrode 151a, and the lower gate electrode 151b are connected to each other by, for example, metal wires (not illustrated).

A turn-on voltage or a turn-off voltage is applied to the gate electrode pad 111. The turn-on voltage is higher than a threshold voltage of the transistor in the cell region 101. The turn-on voltage is, for example, 15 V. The turn-off voltage is equal to or less than the threshold voltage at which the transistor in the cell region 101 not turned on and is, for example, 0 V.

Next, the operation of the IGBT 600 will be described.

In a case in which the IGBT 600 is in an off state, for example, the emitter voltage is applied to the emitter electrode 12. The emitter voltage is, for example, 0 V. The collector voltage is applied to the collector electrode 14. The collector voltage is, for example, equal to or greater than 200 V and equal to or less than 6500 V.

In a case in which the IGBT 600 is in an off state, the turn-off voltage is applied to the gate electrode pad 111. Therefore, the turn-off voltage is also applied to the upper gate electrode 151a and the lower gate electrode 151b. The turn-off voltage is, for example, 0 V.

In a case in which the IGBT 600 is turned on, the turn-on voltage is applied to the gate electrode pad 111. The turn-on voltage is also applied to the upper gate electrode 151a and the lower gate electrode 151b.

The turn-on voltage is higher than the threshold voltage of the transistor in the cell region 101. The voltage higher than a threshold voltage is, for example, 15 V. The transistor having the upper gate electrode 151a in the cell region 101 is turned on. In a case in which the turn-on voltage is applied to the lower gate electrode 151b, an electron accumulation layer is formed on the side of the lower gate electrode 151b in the n-type drift region 32 and the number of carriers accumulated in a portion of the n-type drift region 32 which is close to the emitter electrode 12 increases. Therefore, the on-resistance of the IGBT 600 is reduced.

In a case in which the IGBT 600 is turned off, the turn-off voltage is applied to the gate electrode pad 111. At that time, since the resistive layer 171 is connected to the gate electrode pad 111, the gate resistance of the upper gate electrode 151a is higher than the gate resistance of the lower gate electrode 151b. Therefore, a change in the potential of the upper gate electrode 151a is delayed with respect to the lower gate electrode 151b. As a result, the potential of the lower gate electrode 151b is reduced before the potential of the upper gate electrode 151a is reduced and the electron accumulation layer formed on the side of the lower gate electrode 151b in the n-type drift region 32 is removed. Therefore, the number of carriers accumulated in a portion of the n-type drift region 32 close to the emitter electrode 12 is reduced.

Then, the transistor having the upper gate electrode 151a whose potential change has been delayed is turned off and the IGBT 600 is turned off. At that time, since the number of carriers accumulated in the n-type drift region 32 has already been reduced, the turn-off time is reduced and switching loss is prevented.

In the IGBT 600 according to the sixth embodiment, the resistive layer 171 is used as the gate resistance of the upper gate electrode 151a. The use of the resistive layer 171 makes it possible to delay a change in the potential of the upper gate electrode 151a with respect to a change in the potential of the lower gate electrode 151b. Therefore, it is possible to achieve the double gate driving of the IGBT, without providing two gate electrode pads in the IGBT chip.

Similarly to the IGBT 100 according to the first embodiment, in the IGBT 600 according to the sixth embodiment, the trench that does not electrically connect the emitter electrode and the n drift layer is effectively used for double gate driving. In other words, it is possible to provide the gate resistance of the upper gate electrode 151a in the chip, without increasing an area penalty.

It is preferable that the electrical resistivity of the resistive layer 171 be higher than the electrical resistivity of the upper gate electrode 151a and the electrical resistivity of the lower gate electrode 151b in order to increase the gate resistance connected to the upper gate electrode 151a. Preferably, the resistive layer 171, the upper gate electrode 151a, and the lower gate electrode 151b are made of amorphous silicon or polysilicon including n-type impurities or p-type impurities and the conductive impurity concentration of the resistive layer 171 is lower than the conductive impurity concentration of the upper gate electrode 151a and the conductive impurity concentration of the lower gate electrode 151b.

As described above, according to the sixth embodiment, double gate driving can be achieved by one gate electrode pad.

Seventh Embodiment

A semiconductor device according to a seventh embodiment differs from the semiconductor device according to the sixth embodiment in that the resistive layer has an upper region and a lower region that is provided on the side of the upper region close to the second plane. Hereinafter, the description of the same content as that in the sixth embodiment will not be repeated.

Figure 10:
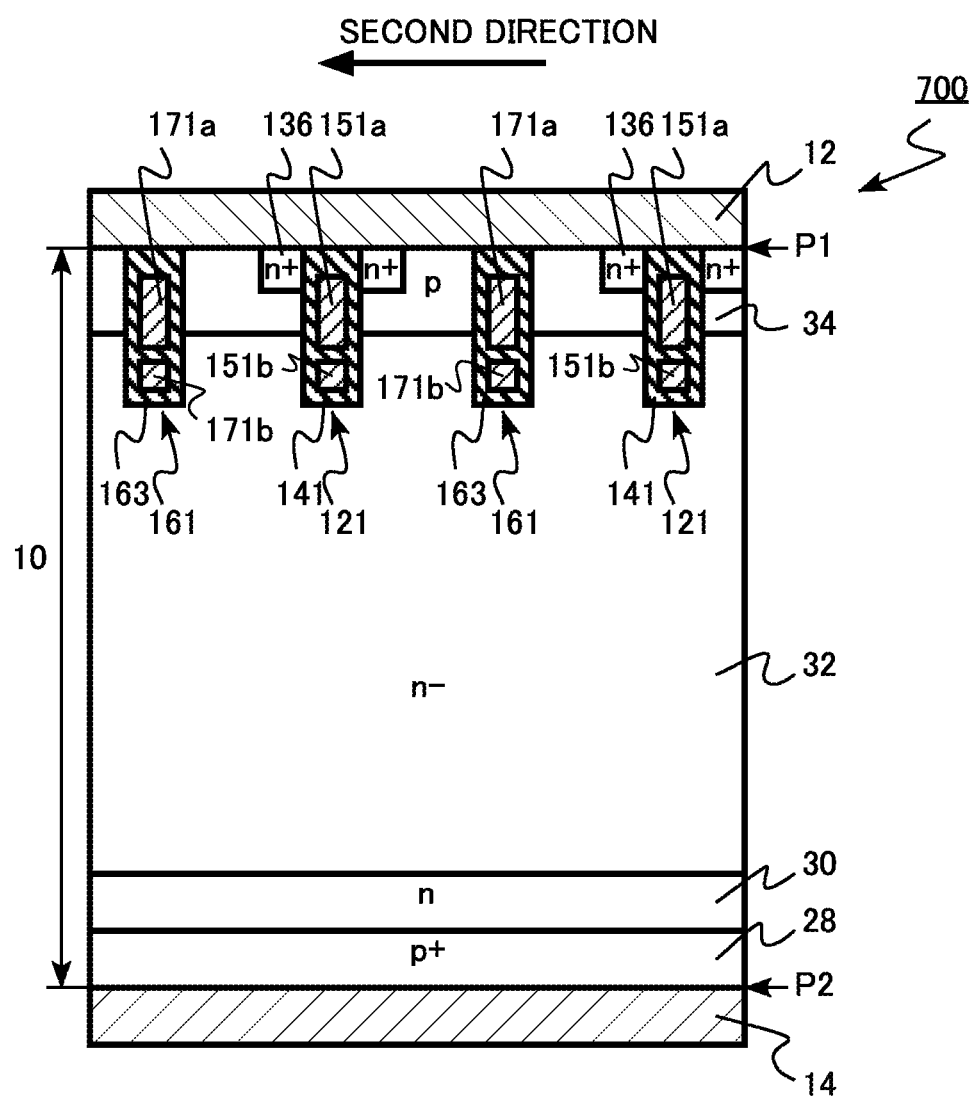
FIG. 10 is a cross-sectional view schematically illustrating a semiconductor device according to a seventh embodiment.

FIG. 10 is a cross-sectional view schematically illustrating the semiconductor device according to the seventh embodiment. FIG. 10 is a cross-sectional view corresponding to the cross-sectional view taken along the line CC' of FIG. 8A.

The semiconductor device according to the seventh embodiment is a trench IGBT 700 in which a gate electrode is provided in a trench formed in a semiconductor layer. The semiconductor device according to the seventh embodiment is a double-gate IGBT 700.

A resistive layer provided in the resistive trench 161 includes an upper region 171a and a lower region 171b. The lower region 171b is provided between the upper region 171a and the second plane P2. Since the resistive layer includes the upper region 171a and the lower region 171b, flexibility in the value of the gate resistance increases.

For example, only one of the upper region 171a and the lower region 171b can be used as the gate resistance. In addition, for example, the upper region 171a and the lower region 171b may be connected in series and may be used as the gate resistance. For example, the upper region 171a and the lower region 171b may be connected in parallel and may be used as the gate resistance.

As described above, according to the seventh embodiment, double gate driving can be achieved by one gate electrode pad. In addition, flexibility in the value of the gate resistance increases.

Eighth Embodiment

A semiconductor device according to an eighth embodiment differs from the semiconductor device according to the first embodiment in that the resistive trench is not provided in the IGBT cell region 101, but is provided in the termination region 102. Hereinafter, the description of the same content as that in the first embodiment will not be repeated.

Figure 11B:
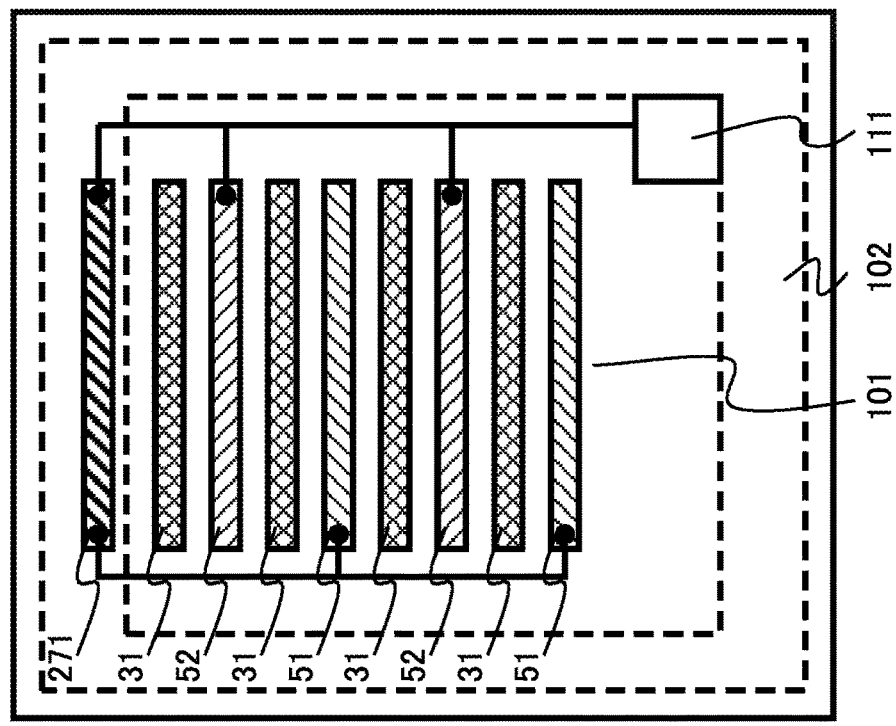
FIGS. 11A and 11B are plan views schematically illustrating a semiconductor device according to an eighth embodiment.
Figure 11A:
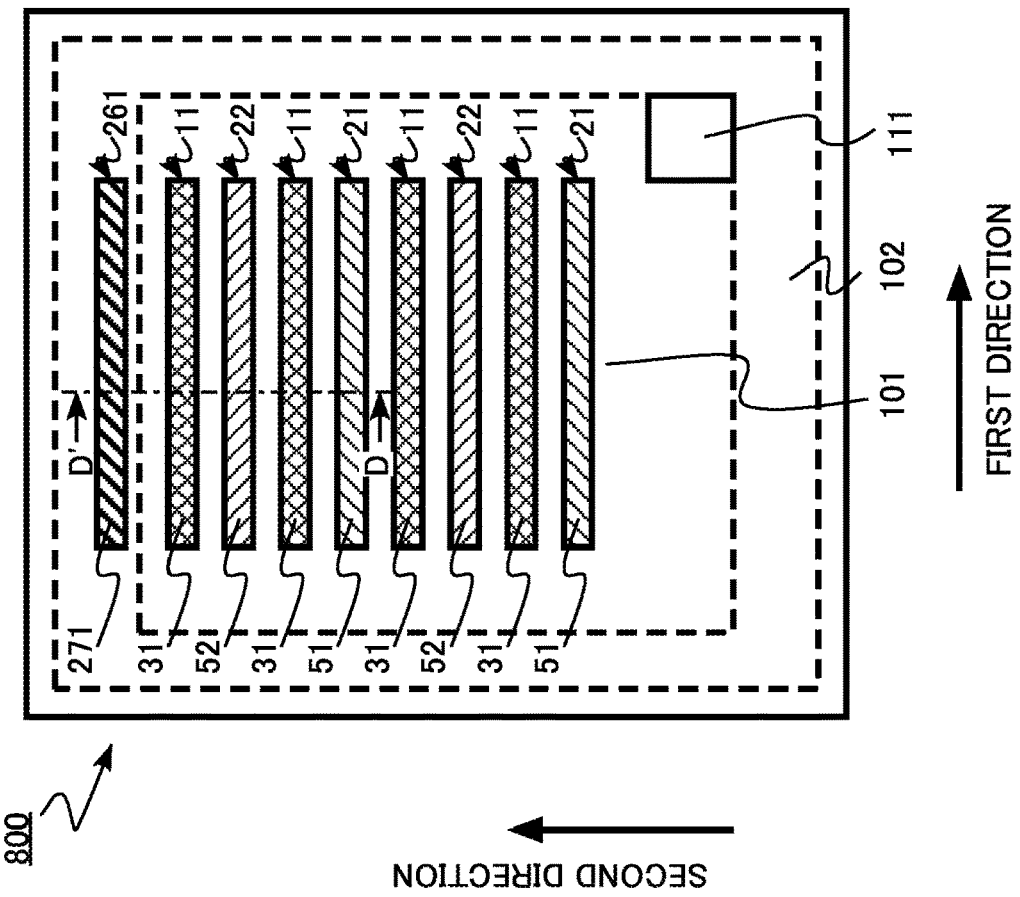
Figure 12:
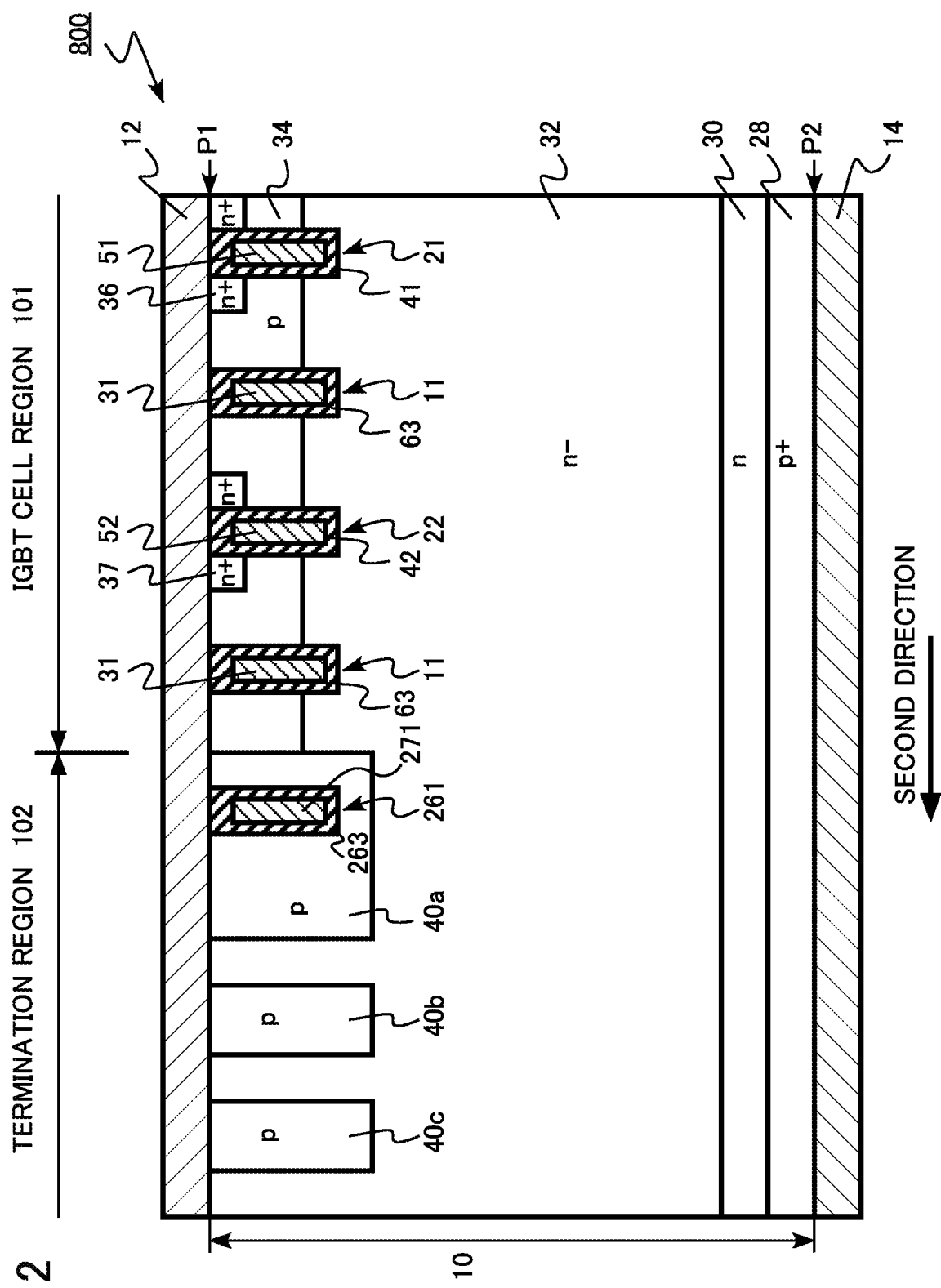
FIG. 12 is a cross-sectional view schematically illustrating the semiconductor device according to the eighth embodiment.

FIGS. 11A and 11B are plan views schematically illustrating the semiconductor device according to the eighth embodiment. FIG. 11A is a pattern layout diagram and FIG. 11B is a diagram in which an electrical connection relationship between patterns is added to FIG. 11A. FIG. 12 is a cross-sectional view schematically illustrating the semiconductor device according to the eighth embodiment. FIG. 12 is a cross-sectional view taken along the line DD' of FIG. 11A.

The semiconductor device according to the eighth embodiment is a trench IGBT 800 in which a gate electrode is provided in a trench formed in a semiconductor layer. The semiconductor device according to the eighth embodiment is a double-gate IGBT 800.

The IGBT 800 according to the eighth embodiment includes an IGBT cell region 101, a termination region 102, and a gate electrode pad 111. The IGBT 800 includes a semiconductor layer 10, an emitter electrode 12, and a collector electrode 14.

The IGBT cell region 101 of the semiconductor layer 10 includes a first gate trench 21 (first trench), a second gate trench 22 (second trench), a first gate electrode 51, a second gate electrode 52, a p-type collector region 28, an n-type buffer region 30, an n-type drift region 32, a p-type base region 34, a first n-type emitter region 36, a second n-type emitter region 37, a first gate insulating film 41, a second gate insulating film 42, a dummy trench 11, a dummy gate electrode 31, and an insulating film 63.

The dummy trench 11 is provided between the first gate trench 21 and the second gate trench 22. The dummy trench 11 extends in a first direction parallel to a first plane P1 an the first plane P1. The dummy trench 11 has a stripe shape. The dummy trenches 11 are repeatedly arranged in a second direction perpendicular to the first direction.

The dummy gate electrode 31 is provided in the dummy trench 11. For example, the dummy gate electrode 31 has the same potential as the emitter electrode 12.

The termination region 102 of the semiconductor layer 10 includes a first p-type guard ring region 40a, a second p-type guard ring region 40b, a third p-type guard ring region 40c, a resistive trench 261, a resistive layer 271, and an insulating film 263.

The depth of the first p-type guard ring region 40a, the second p-type guard ring region 40b, and the third p-type guard ring region 40c is greater than the depth of the p-type base region 34.

The resistive trench 261 is provided in the termination region 102. The resistive trench 261 is provided in the first p-type guard ring region 40a. The depth of the resistive trench 261 is less than the depth of the first p-type guard ring region 40a. The resistive trench 261 extends in the first direction.

The resistive layer 271 is provided in the resistive trench 261. The resistive layer 271 is made of, for example, a semiconductor or metal. The resistive layer 271 is made of, for example, amorphous silicon or polysilicon including n-type impurities or p-type impurities. The resistive layer 271 is electrically connected to the gate electrode pad 111.

For example, the electrical resistivity of the resistive layer 271 is higher than the electrical resistivity of the first gate electrode 51 and the electrical resistivity of the second gate electrode 52. For example, the resistive layer 271, the first gate electrode 51, and the second gate electrode 52 are made of amorphous silicon or polysilicon including n-type impurities or p-type impurities. For example, the conductive impurity concentration of the resistive layer 271 is lower than the conductive impurity concentration of the first gate electrode 51 and the conductive impurity concentration of the second gate electrode 52.

The resistive layer 271 functions as the gate resistance of the first gate electrode 51.

The insulating film 263 is provided between the resistive layer 271 and the first p-type guard ring region 40a. The insulating film 263 is, for example, a silicon oxide film.

The gate electrode pad 111 is provided on the first plane P1 of the semiconductor layer 10. The gate electrode pad 111 is electrically connected to the first gate electrode 51 through the resistive layer 271. For example, as illustrated in FIG.

11B, the gate electrode pad 111 is electrically connected to the first gate electrode 51 through the resistive layer 271 provided in the resistive trench 261.

The gate electrode pad 111 is electrically connected to the second gate electrode 52. The resistive layer 271 s not interposed between the gate electrode pad 111 and the second gate electrode 52.

For example, the gate electrode pad 111, the resistive layer 271, the first gate electrode 51, and the second gate electrode 52 are connected to each other by metal wires (not illustrated).

In the IGBT 800, the resistive trench 261 is provided in the termination region 102. The area of the termination region 102 is relatively large. Therefore, flexibility in the layout pattern of the resistive trench 261 increases. As a result, flexibility in the value of the gate resistance increases.

The termination region 102 needs to have a predetermined width in order to provide, for example, the first p-type guard ring region 40a, the second p-type guard ring region 40b, and the third p-type guard ring region 40c. Therefore, an area penalty caused by the formation of the resistive trench 261 in the termination region 102 is small.

As described above, according to the eighth embodiment, double gate driving can be achieved by one gate electrode pad. In addition, flexibility in the value of the gate resistance increases.

Ninth Embodiment

A semiconductor device according to a ninth embodiment differs from the semiconductor device according to the first embodiment in that it includes a diode region 103 and a resistive trench is not provided in an IGBT cell region 101, but is provided in a boundary region between the IGBT cell region 101 and the diode region 103. Hereinafter, the description of the same content as that in the first embodiment will not be repeated.

Figure 14:
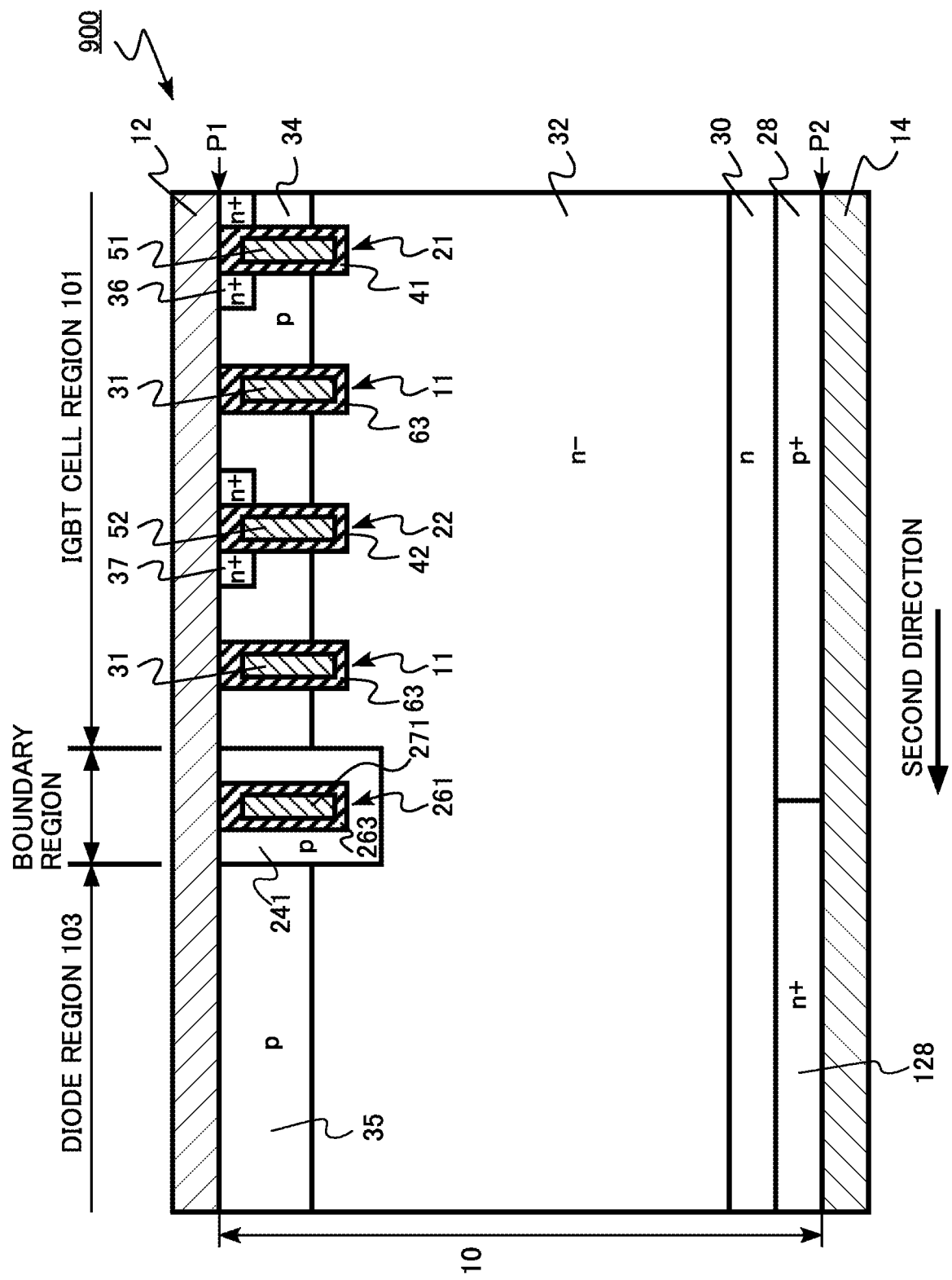
FIG. 14 is a cross-sectional view schematically illustrating the semiconductor device according to the ninth embodiment.

FIGS. 13A and 13B are plan views schematically illustrating the semiconductor device according to the ninth embodiment. FIG. 13A is a pattern layout diagram and FIG. 13B is a diagram in which an electrical connection relationship between patterns is added to FIG. 13A. FIG. 14 is a cross-sectional view schematically illustrating the semiconductor device according to the ninth embodiment. FIG. 14 is a cross-sectional view taken along the line FF' of FIG. 13A.

The semiconductor device according to the ninth embodiment is a so-called reverse conducting-IGBT (RC-IGBT) 900 in which the IGBT cell region 101 and the diode region 103 are provided in one chip.

The RC-IGBT 900 is a trench type in which a gate electrode is provided in a trench formed in a semiconductor layer. In addition, the semiconductor device according to the ninth embodiment is a double-gate RC-IGBT 900.

The RC-IGBT 900 according to the ninth embodiment includes the IGBT cell region 101, a termination region 102, the diode region 103, and a gate electrode pad 111. The RC-IGBT 900 includes a semiconductor layer 10, an emitter electrode 12, and a collector electrode 14.

The IGBT cell region 101 of the semiconductor layer 10 includes a first gate trench 21 (first trench), a second gate trench 22 (second trench), a first gate electrode 51, a second gate electrode 52, a p-type collector region 28, an n-type buffer region 30, an n-type drift region 32, a p-type base region 34, a first n-type emitter region 36, a second n-type emitter region 37, a first gate insulating film 41, a second gate insulating film 42, a dummy trench 11, a dummy gate electrode 31, and an insulating film 63.

The dummy trench 11 is provided between the first gate trench 21 and the second gate trench 22. The dummy trench 11 extends in a first direction parallel to a first plane P1 in the first plane P1. The dummy trench 11 has a stripe shape. The dummy trenches 11 are repeatedly arranged in a second direction perpendicular to the first direction.

The diode region 103 of the semiconductor layer 10 includes a p-type anode region 35 and an n-type cathode region 128. The p-type anode region 35 is a p-type semiconductor region. The n-type cathode region 128 is an $n^+$ semiconductor region.

The emitter electrode 12, the p-type anode region 35, the n-type drift region 32, the n-type buffer region 30, the n-type cathode region 128, and the collector electrode 14 form a PIN diode.

A p-type region 241, a resistive trench 261, a resistive layer 271, and an insulating film 263 are provided in the boundary region between the IGBT cell region 101 and the diode region 103.

The depth of the p-type region 241 is greater than the depth of the p-type base region 34.

The resistive trench 261 is provided in the boundary region between the IGBT cell region 101 and the diode region 103. The resistive trench 261 is provided in the p-type region 241. The depth of the resistive trench 261 is less than the depth of the p-type region 241. The resistive trench 261 extends in the first direction.

The resistive layer 271 is provided in the resistive trench 261. The resistive layer 271 is made of, for example, a semiconductor or metal. The resistive layer 271 is made of, for example, amorphous silicon or polysilicon including n-type impurities or p-type impurities. The resistive layer 271 is electrically connected to the gate electrode pad 111.

For example, the electrical resistivity of the resistive layer 271 is higher than the electrical resistivity of the first gate electrode 51 and the electrical resistivity of the second gate electrode 52. For example, the resistive layer 271, the first gate electrode 51, and the second gate electrode 52 are made of amorphous silicon or polysilicon including n-type impurities or p-type impurities. For example, the conductive impurity concentration of the resistive layer 271 is lower than the conductive impurity concentration of the first gate electrode 51 and the conductive impurity concentration of the second gate electrode 52.

The resistive layer 271 functions as the gate resistance of the first gate electrode 51.

The insulating film 263 is provided between the resistive layer 271 and the p-type region 241. The insulating film 263 is, for example, a silicon oxide film.

The gate electrode pad 111 is provided on a side of the first plane P1 of the semiconductor layer 10. The gate electrode pad 111 is electrically connected to the first gate electrode 51 through the resistive layer 271. For example, as illustrated in FIG. 13B, the gate electrode pad 111 is electrically connected to the first gate electrode 51 through the resistive layer 271 provided in the resistive trench 261.

The gate electrode pad 111 is electrically connected to the second gate electrode 52. The resistive layer 271 is not interposed between the gate electrode pad 111 and the second gate electrode 52.

For example, the gate electrode pad 111, the resistive layer 271, the first gate electrode 51, and the second gate electrode 52 are connected to each other by metal wires (not illustrated).

In the RC-IGBT 900, the resistive trench 261 is provided in the boundary region between the IGBT cell region 101 and the diode region 103. The area of the boundary region is relatively large. Therefore, flexibility in the layout pattern of the resistive trench 261 increases. As a result, flexibility in the value of the gate resistance increases.

In addition, the boundary region needs to have a predetermined width in order to prevent the interference between the IGBT cell region 101 and the diode region 103. Therefore, an area penalty caused by the formation of the resistive trench 261 in the boundary region is small.

As described above, according to the ninth embodiment, double gate driving can be achieved by one gate electrode pad. In addition, flexibility in the value of the gate resistance increases.

Tenth Embodiment

A semiconductor device according to a tenth embodiment differs from the semiconductor device according to the first embodiment in that it includes two cell regions, that is, a first IGBT cell region 101a and a second IGBT cell region 101b and a resistive trench is not provided in the IGBT cell region 101, but is provided in a boundary region between the first IGBT cell region 101a and the second IGBT cell region 101b. Hereinafter, the description of the same content as that in the first embodiment will not be repeated.

Figure 15:
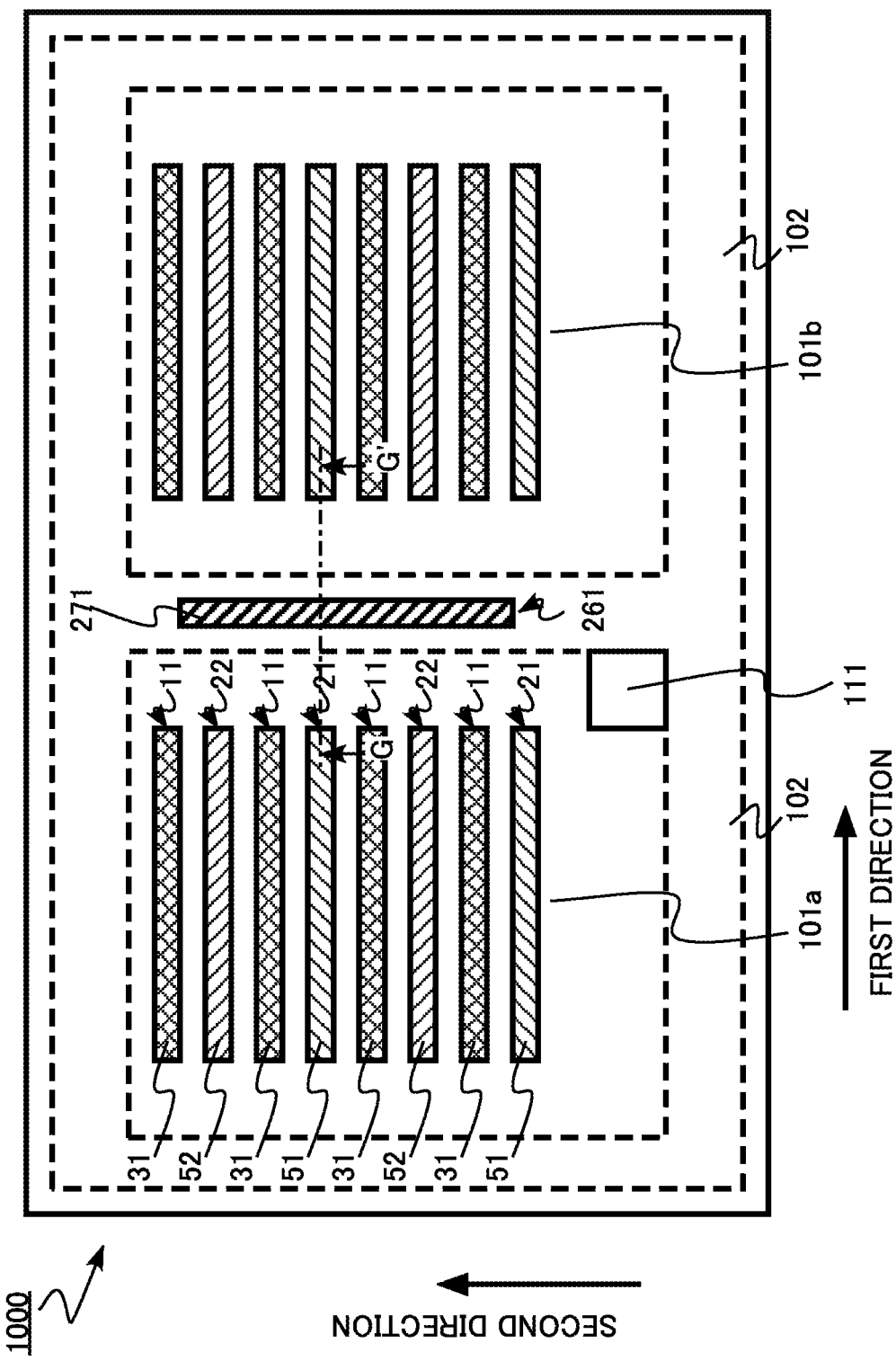
FIG. 15 is a plan view schematically illustrating a semiconductor device according to a tenth embodiment.
Figure 16:
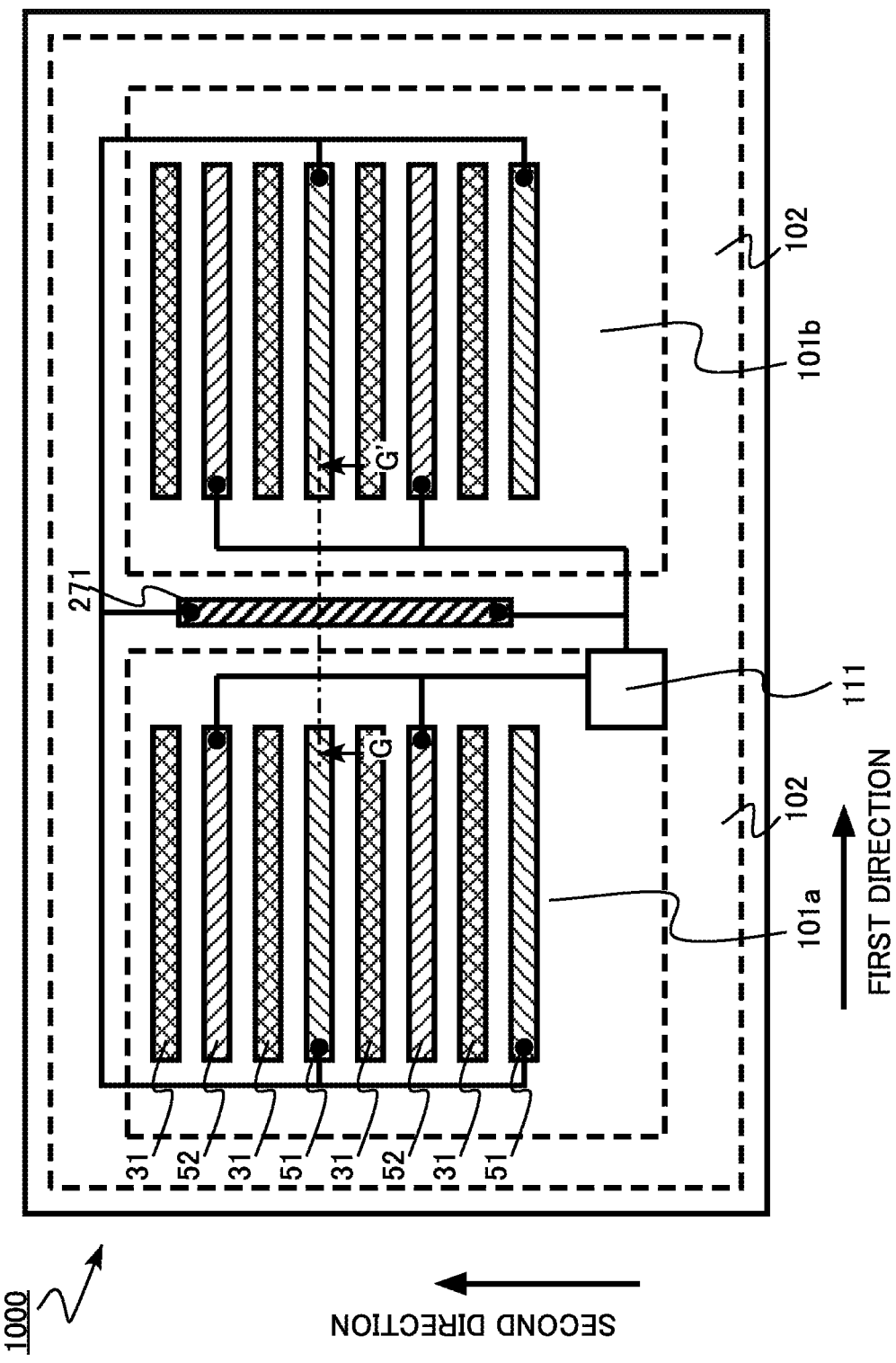
FIG. 16 is a plan view schematically illustrating the semiconductor device according to the tenth embodiment.

FIGS. 15 and 16 are plan views schematically illustrating the semiconductor device according to the tenth embodiment. FIG. 15 is a pattern layout diagram and FIG. 16 is a diagram in which an electrical connection relationship between patterns is added to FIG. 15. FIG. 17 is a cross-sectional view schematically illustrating the semiconductor device according to the tenth embodiment. FIG. 17 is a cross-sectional view taken along the line GG' of FIG. 15.

The semiconductor device according to the tenth embodiment is a trench IGBT 1000 in which a gate electrode is provided in a trench formed in a semiconductor layer. The semiconductor device according to the tenth embodiment is a double-gate IGBT 1000.

The IGBT 1000 according to the tenth embodiment includes the first IGBT cell region 101a, the second IGBT cell region 101b, a termination region 102, and a gate electrode pad 111. The IGBT 1000 includes a semiconductor layer 10, an emitter electrode 12, and a collector electrode 14.

The first IGBT cell region 101a of the semiconductor layer 10 includes a first gate trench 21 (first trench), a second gate trench 22 (second trench), a first gate electrode 51, a second gate electrode 52, a p-type collector region 28, an n-type buffer region 30, an n-type drift region 32, a p-type base region 34, a first n-type emitter region 36, a second n-type emitter region 37, a first gate insulating film 41, a second gate insulating film 42, a dummy trench 11, a dummy gate electrode 31, and an insulating film 63.

The dummy trench 11 is provided between the first gate trench 21 and the second gate trench 22. The dummy trench 11 extends in a first direction parallel to a first plane P1 in the first plane P1. The dummy trench 11 has a stripe shape. The dummy trenches 11 are repeatedly arranged in a second direction perpendicular to the first direction.

The same components as those in the first IGBT cell region 101a are provided in the second IGBT cell region 101b of the semiconductor layer 10. The second IGBT cell region 101b has a layout pattern obtained by reversing the first IGBT cell region 101a with respect to the second direction as a line-symmetric axis.

A p-type region 241, a resistive trench 261, a resistive layer 271, and an insulating film 263 is provided in a boundary region between the first IGBT cell region 101a and the second IGBT cell region 101b. For example, metal wires (not illustrated) are provided in the boundary region. The metal wires connect, for example, the gate electrode pad 111, the resistive layer 27 the fir gate electrode 51, and the second gate electrode 52.

The depth of the p-type region 241 is greater than the depth of the p-type base region 34.

The resistive trench 261 is provided in the boundary region between the first IGBT cell region 101a and the second IGBT cell region 101b. The resistive trench 261 is provided in the p-type region 241. The depth of the resistive trench 261 is less than the depth of the p-type region 241. The resistive trench 261 extends in the first direction.

The resistive layer 271 is provided in the resistive trench 261. The resistive layer 271 is made of, for example, a semiconductor or metal. The resistive layer 271 is made of, for example, amorphous silicon or polysilicon including n-type impurities or p-type impurities. The resistive layer 271 is electrically connected to the gate electrode pad 111.

For example, the electrical resistivity of the resistive layer 271 is higher than the electrical resistivity of the first gate electrode 51 and the electrical resistivity of the second gate electrode 52. For example, the resistive layer 271, the first gate electrode 51, and the second gate electrode 52 are made of amorphous silicon or polysilicon including n-type impurities or p-type impurities. For example, the conductive impurity concentration of the resistive layer 271 is lower than the conductive impurity concentration of the first gate electrode 51 and the conductive impurity concentration of the second gate electrode 52.

The resistive layer 271 functions as the gate resistance of the first gate electrode 51.

The insulating film 263 is provided between the resistive layer 271 and the p-type region 241. The insulating film 263 is, for example, a silicon oxide film.

The gate electrode pad 111 is provided on a side of the first plane P1 of the semiconductor layer 10. The gate electrode pad 111 is electrically connected to the first gate electrode 51 through the resistive layer 271. For example, as illustrated in FIG. 16, the gate electrode pad 111 is electrically connected to the first gate electrode 51 through the resistive layer 271 provided in the resistive trench 261.

The gate electrode pad 111 is electrically connected to the second gate electrode 52. The resistive layer 271 is not interposed between the gate electrode pad 111 and the second gate electrode 52.

For example, the gate electrode pad 111, the resistive layer 271, the first gate electrode 51, and the second gate electrode 52 are connected to each other by metal wires (not illustrated).

In the IGBT 1000, the resistive trench 261 is provided in the boundary region between the first IGBT cell region 101a and the second IGBT cell region 101b. The area of the boundary region is relatively large. Therefore, flexibility in the layout pattern of the resistive trench 261 increases. As a result, flexibility in the value of the gate resistance increases.

The boundary region between the first IGBT cell region 101a and the second IGBT cell region 101b needs to have a predetermined width in order to provide wires for connecting the gate electrodes. Therefore, an area penalty caused by the formation of the resistive trench 261 in the boundary region is small.

As described above, according to the tenth embodiment, double gate driving can be achieved by one gate electrode pad. In addition, flexibility in the value of the gate resistance increases.

In the first to tenth embodiments, a case in which the semiconductor layer is made of single-crystal silicon has been described. However, the material forming the semiconductor layer is not limited to the single-crystal silicon. For example, the semiconductor layer may be made of other single-crystal semiconductors such as single-crystal silicon carbide.

In the first to tenth embodiments, a case in which the trenches are arranged in parallel in a stripe shape has been described. However, the invention can be applied to trenches that are arranged in a mesh shape so as to intersect each other or trenches that are arranged in a dot shape.

In the sixth to tenth embodiments, a case in which the dummy trench is provided in the cell region has been described. However, the dummy trench may not be provided in the cell region.

In the first to tenth embodiments, a case in which the first conductivity type is a p type and the second conductivity type is an n type has been described. However, the first conductivity type may be an n type and the second conductivity type may be a p type.

While certain embodiments have been described, these embodiments have been presented by way of example only, and are not intended to limit the scope of the inventions. Indeed, the semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor layer having a first plane and a second plane opposite to the first plane;
   a first trench provided in the semiconductor layer, the first trench extending in a first direction parallel to the first plane in the first plane;
   a first gate electrode provided in the first trench;
   a second trench provided in the semiconductor layer, the second trench extending in the first direction in the first plane;
   a second gate electrode provided in the second trench;
   a third trench provided in the semiconductor layer;
   a first resistive layer provided in the third trench;
   a first electrode provided on a side of the first plane of the semiconductor layer;
   a second electrode provided on a side of the second plane of the semiconductor layer; and
   a gate electrode pad provided on the side of the first plane of the semiconductor layer, the gate electrode pad being electrically connected to the first gate electrode through the first resistive layer, the gate electrode pad being electrically connected to the second gate electrode.

2. The semiconductor device according to claim 1,
   wherein an electrical resistivity of the first resistive layer is higher than an electrical resistivity of the first gate electrode and an electrical resistivity of the second gate electrode.

3. The semiconductor device according to claim 1,
   wherein the first resistive layer, the first gate electrode, and the second gate electrode are made of amorphous silicon or polysilicon, and
   a conductive impurity concentration of the first resistive layer is lower than a conductive impurity concentration of the first gate electrode and a conductive impurity concentration of the second gate electrode.

4. The semiconductor device according to claim 1,
   wherein the third trench is provided between the first trench and the second trench and extends in the first direction in the first plane.

5. The semiconductor device according to claim 4, further comprising:
   a first semiconductor region of a first conductivity type provided in the semiconductor layer, the first semiconductor region being in contact with the second electrode;
   a second semiconductor region of a second conductivity type provided between the first semiconductor region and the first plane;
   a third semiconductor region of the first conductivity type provided between the second semiconductor region and the first plane;
   a fourth semiconductor region of the second conductivity type provided between the third semiconductor region and the first plane, the fourth semiconductor region being in contact with the first electrode; and
   a fifth semiconductor region of the second conductivity type provided between the third semiconductor region and the first plane, the fifth semiconductor region being in contact with the first electrode,
   wherein the first trench penetrates through the fourth semiconductor region and the third semiconductor region, and
   the second trench penetrates through the fifth semiconductor region and the third semiconductor region.

6. The semiconductor device according to claim 5,
   wherein the third trench penetrates through the third semiconductor region.

7. The semiconductor device according to claim 4, further comprising:
   a fourth trench provided between the third trench and the second trench, the fourth trench extending in the first direction in the first plane; and
   a second resistive layer provided in the fourth trench,
   wherein the gate electrode pad is electrically connected to the first gate electrode through the first resistive layer and the second resistive layer.

8. The semiconductor device according to claim 4, further comprising:
   a first gate insulating film provided between the first gate electrode and the semiconductor layer;
   a second gate insulating film provided between the second gate electrode and the semiconductor layer; and
   an insulating film provided between the first resistive layer and the semiconductor layer, the insulating film being thicker than the first gate insulating film and the second gate insulating film.

9. The semiconductor device according to claim 4,
   wherein a width of the first resistive layer in a second direction perpendicular to the first direction is less than a width of the first gate electrode and the second gate electrode in the second direction.

10. A semiconductor device comprising:
    a semiconductor layer having a first plane and a second plane opposite to the first plane;
    a first trench provided in the semiconductor layer, the first trench extending in a first direction parallel to the first plane in the first plane;
    an upper gate electrode provided in the first trench;

a lower gate electrode provided in the first trench, the lower gate electrode provided between the upper gate electrode and the second plane;

a second trench provided in the semiconductor layer;

a resistive layer provided in the second trench;

a first electrode provided on a side of the first plane of the semiconductor layer;

a second electrode provided on a side of the second plane of the semiconductor layer; and a gate electrode pad provided on the side of the first plane of the semiconductor layer, the gate electrode pad being electrically connector to the upper gate electrode through the resistive layer, the gate electrode pad being electrically connected to the lower gate electrode.

11. The semiconductor device according to claim 10, wherein an electrical resistivity of the resistive layer is higher than an electrical resistivity of the upper gate electrode and an electrical resistivity of the lower gate electrode.

12. The semiconductor device according to claim 10, wherein the resistive layer, the upper gate electrode, and the lower gate electrode are made of amorphous silicon or polysilicon, and a conductive impurity concentration of the resistive layer is lower than a conductive impurity concentration of the upper gate electrode and a conductive impurity concentration of the lower gate electrode.

13. The semiconductor device according to claim 10, wherein the second trench is provided so as to be adjacent to the first trench and extends in the first direction in the first plane.

14. The semiconductor device according to claim 13, further comprising:

a first semiconductor region of a first conductivity type provided in the semiconductor layer, the first semiconductor region being in contact with the second electrode;

a second semiconductor region of a second conductivity type provided between the first semiconductor region and the first plane;

a third semiconductor region of the first conductivity type provided between the second semiconductor region and the first plane; and a fourth semiconductor region of the second conductivity type provided between the third semiconductor region and the first plane, the fourth semiconductor region being in contact with the first electrode, wherein the first trench penetrates through the fourth semiconductor region and the third semiconductor region.

15. The semiconductor device according to claim 14, wherein the second trench penetrates through the third semiconductor region.

16. The semiconductor device according to claim 13, wherein the resistive layer has an upper region and a lower region, the lower region provided between the upper region and the second plane.

* * * * *